US007001693B2

(12) United States Patent
Liebmann et al.

(10) Patent No.: US 7,001,693 B2
(45) Date of Patent: Feb. 21, 2006

(54) BINARY OPC FOR ASSIST FEATURE LAYOUT OPTIMIZATION

(75) Inventors: Lars W. Liebmann, Poughquag, NY (US); Richard A. Ferguson, Pleasant Valley, NY (US); Allen H. Gabor, Katonah, NY (US); Mark A. Lavin, Katonah, NY (US)

(73) Assignee: International Business Machines Corporation, Armonk, NY (US)

( * ) Notice: Subject to any disclaimer, the term of this patent is extended or adjusted under 35 U.S.C. 154(b) by 249 days.

(21) Appl. No.: 10/378,575

(22) Filed: Feb. 28, 2003

(65) Prior Publication Data

US 2004/0170905 A1 Sep. 2, 2004

(51) Int. Cl.
*G03F 9/00* (2006.01)
(52) U.S. Cl. ............... 430/5; 430/30; 716/2; 716/5; 716/11; 716/8; 716/19; 716/21
(58) Field of Classification Search ............... 430/5, 430/30; 716/2, 5, 8, 11, 19, 21
See application file for complete search history.

(56) References Cited

U.S. PATENT DOCUMENTS

| | | |
|---|---|---|
| 5,242,770 A | 9/1993 | Chen et al. |
| 5,447,810 A | 9/1995 | Chen et al. |
| 5,481,473 A | 1/1996 | Kim et al. |
| 5,519,628 A | 5/1996 | Russell et al. |
| 5,528,508 A | 6/1996 | Russell et al. |
| 5,821,014 A | 10/1998 | Chen et al. |
| 5,900,340 A | 5/1999 | Reich et al. |
| 5,958,635 A | 9/1999 | Reich et al. |
| 6,165,693 A | 12/2000 | Lin et al. |
| 6,249,904 B1 | 6/2001 | Cobb |
| 6,261,724 B1 | 7/2001 | Bula et al. |
| 6,265,121 B1 | 7/2001 | Lin |
| 6,282,696 B1 | 8/2001 | Garza et al. |
| 6,284,419 B1 | 9/2001 | Pierrat et al. |

(Continued)

OTHER PUBLICATIONS

Watson et al., "Sub-resolution assist feature and off-axis illumination optimization for 200 and 240 nm contact windows using 248 nm lithography," Feb. 25-27, 1998, Proceedings of the SPIE, International Society for Optical Engineering Conference, vol. 3334, pp. 131-139 (Abstract).

(Continued)

*Primary Examiner*—Saleha R. Mohamedulla
(74) *Attorney, Agent, or Firm*—Todd M. C. Li

(57) ABSTRACT

A method of forming a photolithographic mask layout with Sub-Resolution Assist Feature (SRAF) elements on a mask for correcting for proximity effects for a pattern imaged comprising the steps of developing a layout of mask features for printing main pattern features. Provide a table of SRAF element data including spacing of main pattern features and SRAF elements, applying SRAF elements to the mask layout as a function of spacing of main pattern features and SRAF elements, legalizing the SRAF elements as a function of style options, and providing a target pattern comprising a modified layout for the mask, identifying problem edge segments of an SRAF element of the target pattern at risk of causing a printing defect, applying a selected bias to the problem edge segments to modify the pattern where there are areas of SRAF element loss, and providing an output of a modified pattern with modified SRAF elements removing the areas of SRAF element loss. The system can provide SRAF elements to the mask layout as a function of spacing of main pattern features and SRAF elements may be based on data from the SRAF table; or the system can applying model based OPC for exposure dose values based on data from the SRAF table.

13 Claims, 11 Drawing Sheets

U.S. PATENT DOCUMENTS

| | | |
|---|---|---|
| 6,301,008 B1 | 10/2001 | Ziger et al. |
| 6,303,253 B1 | 10/2001 | Lu |
| 6,413,683 B1 | 7/2002 | Liebmann et al. |
| 6,421,820 B1 | 7/2002 | Mansfield et al. |

OTHER PUBLICATIONS

TCAD development for lithography resolution enhancement, Liebmann, et al IBM J. Res. & Dev. vol. 45 No. 5 Sep. 2001 SPIE microlithography 2002 Mar. 3-8, 2002 santa Clara, A Published Aug. 2, 2002 vol. 4691 Optical Microlithography XV, Gabor, et al.

"Assist Features—Challenges And Opportunities" —J. Bruce, et al. Proceedings Of The Microlithography Symposium Interface 2000 Sponsored By Arch Chemicals, Inc. Nov. 5-7, 2000 San Diego, California.

"Lithographic Comparison Of Assist Feature Design Strategies"—Mansfield, et al. Proc. of SPIE vol. 4000, Optical Microlithography XIII (Mar. 2000) pp. 63-76.

"Resolution Enhancement Techniques In Optical Lithography, It's Not Just A Mask Problem"—Liebmann, et al. Proceedings of SPIE—The International Society For Optical Engineering vol. 4409 (2001) p. 23-32.

"Optimizing Style Options For Sub-Resolution Assist Features"—Liebmann, et al. In Proc. SPIE, vol. 4346, SPIE, (2001).

"Use of A Single Size Square Serif For Variable Print Bias Compensation In Microlithograph: Method, Design, and Practice"—A. Starikov pp. 34-46, SPIE vol. 1088 Optical/Microlithography (1989).

"Assist Features—Challenges And Opportunities"—J. Bruce, et al. Proceedings Of The Microlithography Symposium Interface 2000 Sponsored By Arch Chemicals, Inc. Nov. 5-7, 2000 San Diego, California.

BINARY OPC FOR ASSIST FEATURE LAYOUT OPTIMIZATION

BACKGROUND OF THE INVENTION

1. Field of the Invention

This invention relates to photolithography and more particularly to proximity correction in the presence of subresolution assist features used in photolithography.

2. Description of Related Art

A very large scale integrated (VLSI) complementary metal oxide semiconductor (CMOS) chip is manufactured on a silicon wafer by a sequence of material additions (i.e., low pressure chemical vapor depositions, sputtering operations, etc.), material removals (i.e., wet etches, reactive ion etches, etc.), and material modifications (i.e., oxidations, ion implants, etc.). These physical and chemical operations interact with the entire wafer. For example, if a wafer is placed into an acid bath, the entire surface of the wafer will be etched away. In order to build very small electrically active devices on the wafer, the impact of these operations has to be confined to small, well defined regions.

Lithography in the context of VLSI manufacturing of CMOS devices is the process of patterning openings in photosensitive polymers (sometimes referred to as photoresists or resists) which define small areas in which the silicon base material is modified by a specific operation in a sequence of processing steps. The process of manufacturing of CMOS chips involves the repeated patterning of photoresist, followed by an etch, implant, deposition, or other operation, and ending with the removal of the expended photoresist to make way for the new resist to be applied for another iteration of this process sequence.

The basic lithography system consists of a light source, a stencil or photo mask containing the pattern to be transferred to the wafer, a collection of lenses, and a means for aligning existing patterns on the wafer with patterns on the mask. The aligning may take place in an aligning step or steps and may be carried out with an aligning apparatus. Since a wafer containing from 50 to 100 chips is patterned in steps of 1 to 4 chips at a time, these lithography tools are commonly referred to as steppers. The resolution, R, of an optical projection system such as a lithography stepper is limited by parameters described in Raleigh's equation:

$$R = k\lambda/NA,$$

where $\lambda$ represents the wavelength of the light source used in the projection system and NA represents the numerical aperture of the projection optics used. "k" represents a factor describing how well a combined lithography system can utilize the theoretical resolution limit in practice and can range from about 0.8 down to about 0.5 for standard exposure systems. The highest resolution in optical lithography is currently achieved with deep ultra violet (DUV) steppers operating at 248 nm. Wavelengths of 356 nm are also in widespread use and 193 nm wavelength lithography is becoming commonplace.

Conventional photo masks consist of chromium patterns on a quartz plate, allowing light to pass wherever the chromium has been removed from the mask. Light of a specific wavelength is projected through the mask onto the photoresist coated wafer, exposing the resist wherever hole patterns are placed on the mask. Exposing the resist to light of the appropriate wavelength causes modifications in the molecular structure of the resist polymers which, in common applications, allow a developer to dissolve and remove the resist in the exposed areas. Such resist materials are known as positive resists. (Negative resist systems allow only unexposed resist to be developed away.) The photo masks, when illuminated, can be pictured as an array of individual, infinitely small light sources which can be either turned on (points in clear areas) or turned off (points covered by chrome). If the amplitude of the electric field vector which describes the light radiated by these individual light sources is mapped across a cross section of the mask, a step function will be plotted reflecting the two possible states that each point on the mask can be found (light on, light off).

These conventional photo masks are commonly referred to as Chrome-on-Glass (COG) binary masks, due to the binary nature of the image amplitude. The perfectly square step function of the light amplitude exists only in the theoretical limit of the exact mask plane. At any given distance away from the mask, such as in the wafer plane, diffraction effects will cause images to exhibit a finite image slope. At small dimensions, that is, when the size and spacing of the images to be printed are small relative to the $\lambda$/NA, electric field vectors of adjacent images will interact and add constructively. The resulting light intensity curve between the image features is not completely dark, but exhibits significant amounts of light intensity created by the interaction of adjacent features. The resolution of an exposure system is limited by the contrast of the projected image, that is, the intensity difference between adjacent light and dark image features. An increase in the light intensity in nominally dark regions will eventually cause adjacent features to print as one combined structure rather than discrete images.

The quality with which small images can be replicated in lithography depends largely on the available process latitude; that is, that amount of allowable dose and focus variation that still results in correct image size.

Sub-Resolution Assist Features (SRAF), also known as scattering bars, intensity leveling bars and assist bars, referred to hereinafter as SRAF elements have been demonstrated to yield significant improvement in the lithographic process window when used in conjunction with Off-Axis Illumination (OAI) J. Bruce, M. Cross, L. Liebmann, S. Mansfield, and A. McGuire, entitled "Assist Features—Challenges and Opportunities", Proceedings of the Microlithography Symposium Interface 2000 Sponsored by Arch Chemicals, Inc. Nov. 5–7, 2000 San Diego, Calif. See also U.S. Pat. No. 5,242,770 of Chen et al. for "Mask for Photolithography" and U.S. Pat. No. 5,821,014 of Chen for "Optical Proximity Correction Method for Intermediate-pitch Features Using Sub-Resolution Scattering Bars on a Mask".

Methodologies for generating rules for the placement and size of SRAF elements are known and have been described in U.S. Pat. No. 6,421,820 of Mansfield et al. entitled "Semiconductor Device Fabrication Using a Photomask with Assist Features" and in an article by Mansfield et al. entitled "Lithographic Comparison of Assist Feature Design Strategies" Proc. of SPIE Vol. 4000, Optical Microlithography XIII (March, 2000) pp. 63–76

Challenges in fitting the inherently one-dimensional SRAF elements into two-dimensional circuit layouts are described in: Liebmann et al. "Optimizing Style Options for Sub-Resolution Assist Features," in Proc. SPIE, Vol. 4346, SPIE, (2001). This article describes clean up rules for insuring manufacturability and good image quality and describes the negative effects of locally missing SRAF elements on the print quality of the primary circuit patterns.

Also mentioned are challenges in integrating the SRAF design with model-based approaches.

U.S. Pat. No. 6,413,683 Liebmann et al. for "Method for Incorporating Sub Resolution Assist Features in a Photomask Layout" describes style options used to clean up mask designs to insure manufacturability and image quality.

Also, see Liebmann et al. "TCAD Development for Lithography Resolution Enhancement" IBM J. RES. DEV. VOL. 45, No. 5, September 2001 pages 651–665 shows a partial SRAF rules table. In addition, see Liebmann, L. W. "Resolution Enhancement Techniques in Optical Lithography, It's Not Just a Mask Problem", Proceedings of SPIE—The International Society for Optical Engineering Vol. 4409 (2001) p. 23–32.

None of the above patents or the above articles discusses proximity correction of subresolution assist features used in photolithography.

PROBLEM SOLVED BY THE INVENTION

Semiconductor manufacturing employs computer-aided-design (CAD for the accurate printing of patterns on the surface of a device substrate. The printing process employs optical lithography followed by a variety of subtractive (e.g., etch) and additive (e.g., deposition) processes. A quartz plate coated with metallic patterns known as a photomask which contains a magnified image of the computer generated pattern to be etched into the metallic layer. An illuminated image projected from the photomask is focused onto a photoresist thin film formed on the substrate. In the past, when lithography required less precision, the circuit layout equaled the mask pattern which equaled the wafer pattern.

As a result of the interference and processing effects which occur during pattern transfer, images formed on the substrate do not faithfully reproduce the patterns on the photomask and deviate from their ideal dimensions and shape as represented by the design computer images. These deviations depend on the characteristics of the patterns as well as on a variety of process conditions. Because these deviations can significantly effect the performance of the semiconductor device, many approaches have been pursued which focus on CAD compensation schemes which ensure a resultant ideal image.

A known compensation technique employed in connection with this invention is to add Sub-Resolution Assist Features (SRAFs), otherwise known as scattering bars or intensity leveling bars, to the photomask. SRAF's are sub-lithographic features placed adjacent to a feature that is to be printed. Since these additional features are sub-lithographic, they will not be transferred to the resist during printing. They will, however, aid in sharpening the image that is printed.

It is well known that the addition of SRAFs to a photomask can help to improve the Process Window (PW) for printing isolated features, where the Process Window is the range of lithographic process conditions (e.g. a range of expouse dose and defocus conditions) under which one can print a feature reliably. It is also known that the number of SRAFs that should be placed in the space between two critical features and the size of the assist features should be adjusted depending on the spacing between the critical features, among other things. What is not well known, however, is how to determine the optimum sizes and spacings for SRAFs in a real design containing critical features of varying size and a continuum of spacings between critical features. This task is complicated by the random nature and large data sizes of semiconductor designs. As dimensions became smaller proximity effects raised problems which caused the wafer pattern produced to diverge from the desired circuit layout. Thus the Optical Proximity Correction (OPC) process was implemented which caused the mask pattern to differ from the circuit layout so that the wafer pattern equaled the circuit layout. Then SRAF features were added which made the mask pattern more complicated and less like the circuit layout, but in some cases the addition of the SRAF features helped to improve the quality of the wafer pattern produced.

Currently, software has been designed with two approaches to assist feature generation. One is a straight Rules Based approach, where a simple set of SRAF design rules are used to generate SRAFs, along with applying Rules Based OPC to critical features. Another approach is to try to improve upon the rules based corrections, by using iterative Model Based corrections to the critical features after the SRAFs have been added to the mask layout. The problems with both of these approaches is that they are based on a simple rules based addition of the SRAFs, where generally one or two SRAFs are added in the space between the two critical features and parallel thereto.

SRAF features produced by the simple rules above do not necessarily provide the desired result of reproducing the intended design image on the photoresist nor can they necessarily be manufactured reliably on the mask as illustrated in FIG. 2. Thus, to maintain a manufacturable layout, some of SRAFs need to be erased or legalized "cleaned up". As shown by FIG. 3 below, the process of "cleaning up" SRAF elements leaves edge segments that do not get the benefit of SRAF features. These feature segmentss that are missing SRAF features print small and with poor quality. The features print small because the edges appear to be isolated and the proximity effect masks isolated edges which print too thin or too small and/or with poor quality because the lithography is set up to print features assisted with SRAFs, but which are missing in the mask.

FIG. 1, shows an example of a two-dimensional layout 10 of a pattern of vertical and horizontal pattern elements to be exposed and printed photolithograpically. The pattern elements include a horizontal pattern bar H1 and two vertical pattern bars V1/V2 which represent the features of hypothetical MOSFET gate electrode patterns. In particular, FIG. 1 shows three primary features targeted for SRAF shaded elements including a horizontal pattern bar H1 on the top. Therebelow are two relatively closely spaced parallel vertical pattern bars V1 and V2, on the left and on the right respectively. The tops of the two bars V1 and V2 are closely spaced just below the horizontal pattern bar H1, extending downwardly. Analysis of the pattern of FIG. 1 with respect to the y axis and the x axis shown on the lower right indicates that for a series of parallel vertical scans from left to right the scanning system will encounter five segments of the pattern below the horizontal bar H1. On the left portion of FIG. 1, indicated by "a" the scan will encounter only the leading and trailing edges of the bar H1. Then in the segment indicated by "b", the scan will encounter the leading and trailing edges of bar H1 followed by a narrow gap between H1 and the top of bar V1. For the middle segment "c" the scan will encounter only the leading and trailing edges of the bar H1. For the next segment "d", the scan will encounter the leading and trailing edges of bar H1 followed by a narrow gap between H1 and the top of bar V2. The CAD system measures the distances between the bar H1 and the vertical bars V1 and V2 respectively.

Unacceptable Designs Due to Unconstrained Interpretation of SRAF Rules Table

In two-dimensional layout situations, such as the one illustrated in FIG. 1, the interaction of non-projecting edges or the abrupt change in the proximity environment of adjacent features can lead to SRAF designs that are not acceptable as illustrated by FIG. 2. In FIG. 2, the SRAF elements which have been produced are too close together and/or cross over each other producing too dense a pattern of SRAF patterns which will be likely to print unwanted images.

FIG. 2 shows a photolithograpic mask 12 patterned for printing the layout 10 of FIG. 1 using the Rules Based approach, following an unconstrained interpretation of the SRAF rules table. As a result of the scans of the images in FIG. 1, using Rules Based approach, the CAD system determines that the horizontal bar required a pair of parallel SRAF bars A1 and A2 above the bar H1 and bars A3 and A4 below the bar H1. In addition, the vertical SRAF bars include five vertical SRAF bars including vertical SRAF A5 and A6 on the left of bar V1, vertical SRAF A7 in the middle and vertical SRAF bars A8 and A9 on the right of bar V2. The result shown in FIG. 2 is unacceptable since it can lead to defective patterns in the final product where the SRAFs intersect thereby creating thicker more concentrated features which may be printed adjacent to the pattern of FIG. 1.

Referring to FIG. 2 in more detail, in addition to the three primary features (horizontal pattern bar H1 and vertical pattern bars V1/V2), horizontal SRAF bars and five vertical SRAF bars are shown. The upper two parallel horizontally extending SRAF elements A1/A2 parallel with the horizontal pattern bar H1 stacked thereabove are spaced very closely thereto. In addition, the two parallel horizontally extending SRAF elements A3/A4 parallel with the horizontal pattern bar H1 stacked therebelow are also spaced very closely thereto. The vertical SRAF elements include two vertically extending SRAF elements A5/A6 parallel with the vertical pattern bar V1 to the left thereof and spaced very closely thereto, two vertically extending SRAF elements A8/A9 parallel with the vertical pattern bar V2 to the right thereof and spaced very closely thereto, and one vertically extending SRAF elements A7 parallel with the vertical pattern bars V1/V2 therebetween and spaced very closely thereto. The two horizontally extending SRAF elements A3/A4 (clear) form unacceptable designs in that they extend horizontally across other elements and features unacceptably extending between the tops of the vertically extending SRAF elements A6/A7/A8, and the vertical pattern bars V1 and V2. FIG. 2 is described in more detail below.

Horizontal SRAF Elements

In FIG. 2 the four horizontal SRAF bars A1, A2, A3, and A4 combined with the horizontal pattern bar H1 form a horizontal grating pattern of five horizontal bars. In particular, the horizontal grating is formed by the horizontally extending elements of the pattern-shown, which include the two upper horizontal SRAF bars A1/A2 parallel with the horizontal bar H1 thereabove and two lower horizontal SRAF bars A3 and A4 parallel with the horizontal pattern bar H1 therebelow. The SRAF features on the mask are, by definition as SRAF elements, below the exposure system resolution, i.e. sub-resolution. Thus the four horizontal SRAF bars A1–A4 are sufficiently narrower than the primary features (horizontal pattern bar H1 and vertical pattern bars V1/V2) to be left unprinted by the exposure system being employed. In summary, the horizontal SRAF bars A1–A4 which are Sub-Resolution Assist Features (SRAF) will not print, but they can influence the optical performance of the exposure system, by forming a horizontally extending optical grating, as will be well understood by those skilled in the art.

Vertical SRAF Elements

In FIG. 2, the five vertical SRAF lines A5, A6, A7, A8 and A9 qualify as Sub Resolution Assist Features (SRAF); and the five vertical SRAF lines A5, A6, A7, A8 and A9 combined with vertical pattern bars V1/V2 form a vertical grating pattern of seven vertical bars. As indicated above the two vertical SRAF bars A5/A6 extend in parallel with the vertical pattern bars V1, to the left thereof, and the two vertical SRAF lines A8/A9 extend in parallel with the vertical pattern bars V2, to the right thereof. In addition, the vertical SRAF bar A7 is parallel with the vertical pattern bars V1/V2 located midway therebetween. In summary, the vertical SRAF bars A5–A9 which are Sub Resolution Assist Features (SRAF) will not print, but they can influence the optical performance of the exposure system, by forming a vertically extending optical grating, as will be well understood by those skilled in the art.

The problem with the mask 12 of FIG. 2 is that the lower horizontal SRAF bars A3/A4 intersect/overlap the vertical pattern bars V1/V2 as well as the five vertical SRAF bars A5–A9, which will not produce the result desired, as will be explained below. The problematic pattern shown in FIG. 2 is the;kind of result obtained by the use of a simple algorithm for the creation of an SRAF pattern. Accordingly, FIG. 2 illustrates how the narrow gaps between SRAF elements and intersecting SRAF elements can cause unwanted images on the wafer and make masks unsuitable for manufacturable.

Careful optimization of style options is necessary to obtain a manufacturable mask and to prevent lithography yield loss through generation of unwanted residual SRAF images, while maximizing the density of the SRAF elements. The goal when optimizing style options is to attempt placement of SRAF elements for all critical features while maintaining manufacturable configurations of SRAF elements.

Layout with Optimized Pattern of SRAF Elements

FIG. 3 shows the result of the step of legalization or cleaning up the pattern of SRAFs in FIG. 2 in an attempt to achieve the goal of optimizing style options is to attempt placement of SRAF elements for all critical features while maintaining manufacturable configurations of SRAF elements. In FIG. 3 the photolithograpic mask 14 is a "cleaned up" modification of the mask 12 of FIG. 2. The mask 14 is patterned for printing the layout 10 of FIG. 1 with an optimized pattern of the SRAF elements which can produce mask patterns which are manufacturable under some circumstances.

In FIG. 3, a sample two-dimensional layout is shown with an optimized pattern of the SRAF elements of FIG. 2 with similar elements of the drawing being identified by the same reference indicia. Elements A1/A2 of FIG. 2 remain unchanged, but the central portion of horizontal SRAF bar A3 has been removed leaving in its place the pair of short horizontal .SRAF bars A3' remaining from the left and right ends of SRAF bar A3. The short horizontal SRAF bars A3' terminate at the intersections with unshortened elements A6/A8 leaving a gap therebetween (in comparison to FIG. 2) above vertical pattern bars V1/V2 and vertical SRAF bar A7.

Similarly, the central portion of horizontal SRAF bar A4 has been removed leaving the pair of even shorter horizontal SRAF bars A4' remaining from the left and right ends of SRAF bar A4. The short horizontal SRAF bars A4' terminate at the intersections with shortened vertical SRAF elements A5'/A9' leaving a gap in place of SRAF bar A4 therebetween, as contrasted to FIG. 2. That is to say that the horizontal SRAF bar A4 has been has been replaced by horizontal SRAF bars A4' which terminate at the intersections with elements A5'/A9'. This leaves a gap where bar A4 extended between the vertical elements A5 and A9, since the SRAF bars A4' do not cross the other vertical bars A6, V1, A7', V2, and A8. Note that the vertical SRAF bar A7' has been lowered to the level of the tops of the two vertical bars V1/V2 of the layout pattern of FIG. 1.

Above the tops of pattern bars V1/V2 and SRAF bar A7 there is now a wider open "feature missing" space FM where SRAF features are missing since the gap between the lower edge of the horizontal pattern bar H1 and the upper ends of the vertical pattern bars V1/V2 and SRAF bar A7 exceeds the parameters of TABLE I, as will be discussed in further detail below. The problem with the wider space FM between bar H1 and the tops of bars V1, A7' an V2 is that H1 has not SRAFs where they should be and so H1 is likely to print too narrowly with a poor Process Window (PW).

To solve the problem of FIG. 3 where the "feature missing" space fM adjacent to bar H1 is too wide, the system may widen the bar H1 where the SRAFs are missing due to the legalization "clean up" process. Rules Based and Model Based methods of solving this problem are described in connection with FIGS. 4 and 5 below. However those solutions lead to the problems described in connection with FIGS. 6 and 7 below leading to the improved methods of this invention described with respect to FIGS. 8, 9, 10A and 10B below.

SUMMARY OF THE INVENTION

It is therefore an object of this invention to present a method and software implementation to compensate for image size deviation and lithographic process window degradation in areas of localized SRAF elements-loss due to legalization to conform to manufacturability and other imaging constraints.

The inventive method, hereinafter referred to as Binary OPC, is a process used to identify all critical edge segments that are problem edge segments in that after SRAF legalization (cleanup) of a pattern of SRAF features, there is a spacing from the edge segment in question to its nearest projecting neighbor (primary-or assist-feature) that exceeds the maximum allowable spacing according to an SRAF rules table, e.g. Table I below. This maximum spacing is derived from the larger of either the largest unassisted feature spacing or the largest inner assist feature placement. Having identified the problem edge segments, binary OPC applies the largest feature bias called for in the rules table to the feature edge segment in question.

Implemented in the rules-based OPC SRAF design flow, the effect of binary OPC is to widen critical feature edges to compensate for the under-biasing resulting from the shortcomings of the one-dimensional SRAF rules table below. While this simple binary sort-and-widen approach of critical edge correction cannot promise to reproduce the original feature size accurately, it prevents catastrophic failures due to feature pinching. Binary OPC still has utility when using model-based OPC. Even though in model-based OPC, the line width at best focus will be corrected, the limited Depth of Focus (DOF) of an unassisted line can cause catastrophic failures. Thus, binary OPC in conjunction with optimized SRAF style options, yields a superior gate level process whether rule-based or modelOPC is used.

Thus there is a need for a solution to that problem which is provided by the present invention which provides a way to find edge segments of primary features that should have SRAF features which are missing, to bias the primary features so that they print large (although with poor process window) rather than small and with poor process window. Thus, the present invention (binary OPC) makes the pattern a little more robust, since small and poor quality edge segments have a tendency to break. Two ways of biasing these primary edge segments: 1) go in and "push the edge out"; i.e. move the edge out by a certain amount; or 2) provide the model-based OPC tool with a target -pattern having a target edge pushed out to indicate that the line to be printed is wider thereby causing the model-based OPC tool to move the edge in the desired direction to produce a suitable result. The benefit of this process of causing the model based OPC to widen the line by pushing the edge to widen the image is that the model-based OPC tool keeps track of all the surrounding features and will help prevent turning one problem (a small/narrow and poor quality line) into a new problem which would result in features that are too wide and/or and merged with neighboring features.

| Glossary | |
|---|---|
| Circuit layout | = collection of polygons representing the desired wafer images<br>= initial target pattern |
| Critical Dimension (CD) | = For a given semiconductor device the CD is the narrowest width of a line or narrowest space between two lines is referred to as the of the device. |
| Main pattern features | = Polygons that are rendered on the photomask and on the wafer |
| Mask Layout | = collection of polygons to be patterned on the photomask |
| Mask Pattern | = Mask Layout |
| Minimum pitch | = The minimum total of the width of a feature plus the distance to the adjacent feature edge. |
| Model-based OPC | = feature selective biasing of the mask patterns to compensate for systematic patterning errors based on iterative movement of feature edges to reduce the difference between a simulated contour that is calculated using a calibrated process model and the desired wafer pattern, also known as the target pattern. In most cases, the target pattern is identical to the circuit layout. |
| OPC | = Optical Proximity Correction |
| Rules-based OPC | = feature selective biasing of the mask patterns to compensate for systematic patterning errors based on pre-computed bias values that are communicated to the OPC tool in form of rules tables |
| SRAF elements | = Polygons that are added to a layout to improve PW, rendered on the photomask but not on the wafer. |
| SRAF | = Sub-Resolution Assist Features |
| Wafer Pattern | = collection of polygons that result on the wafer as a result of the lithography operation |

In accordance with this invention, a method and a system are provided for forming a photolithographic mask layout with Sub-Resolution Assist Feature (SRAF) elements on a mask for correcting for proximity effects for a pattern imaged comprising the following steps. Develop a layout of mask features for printing main pattern features. Provide a table of SRAF element data including spacing of main pattern features and SRAF elements, applying SRAF elements to the mask layout as a function of spacing of main pattern features and SRAF elements, legalizing the SRAF elements as a function of style options to result in a modified mask layout. Analyze the modified layout for the mask, identifying problem edge segments of a primary element of the mask layout that is at risk of causing a printing defect, applying a selected bias to the problem edge segments to modify the mask pattern where there are areas of SRAF element loss. Finally, provide an output of a modified mask pattern with modified SRAF elements.

In accordance with another aspect of this invention employing a rules-based approach, the system can provide SRAF elements to apply a bias to circuit features for the mask as a function of main feature spacing according to SRAF rules based on data from the SRAF table. The selected bias is applied to modify the mask pattern locally in areas of SRAF loss.

As an alternative aspect of this invention, in a model based approach the system can apply model based OPC in the presence of SRAF elements by biasing problem edge segments in the target pattern provided as input to the process model, to form modified target patterns using data from the SRAF table.

With respect to the function of applying a selected bias to the problem edge segments to modify the pattern, the invention employs the following functions:

(h) identifying each critical edge of a feature,
(i) testing whether an edge segment is spaced from its nearest projecting neighboring feature that exceeds the maximum allowable spacing according to said table of SRAF rules,
(j) if the answer to the test in step (i) is YES, then proceed to step (k) if the answer to the step in test (i) is NO then proceeding to step (l),
(k) applying a largest feature bias called for in said table of SRAF rules to the feature edge segment in question and then the system proceeds to step (l),
(l) testing whether all critical edges of a feature have been tested and if a NO answer is obtained return to step (h) or if a YES answer is obtained, then end the binary OPC process. Preferably, the function of applying a selected bias to the problem edge segments to modify the pattern, the invention employs the following function. If the answer in step (i) is YES, then test whether the segment in question is connected to an orthogonal feature or a corner and if the answer is YES, then proceeding to step (k) and if the answer is NO, then proceeding to step (l).

BRIEF DESCRIPTION OF THE DRAWINGS

The foregoing and other aspects and advantages of this invention are explained and described below with reference to the accompanying drawings, in which.

PROBLEM ENCOUNTERED IN MASK DESIGN

Figure 1:
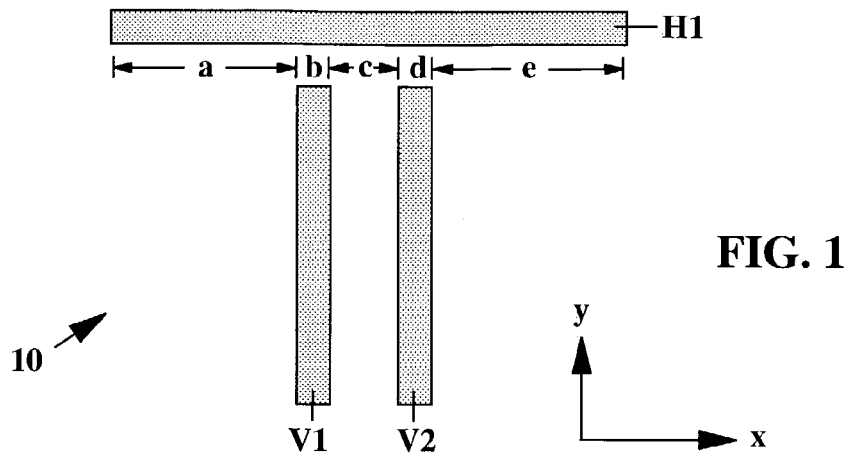
FIG. 1 shows an example of a two-dimensional layout of a pattern to be exposed and printed photolithograpically including a horizontal bar and two vertical bars therebelow.
Figure 2:
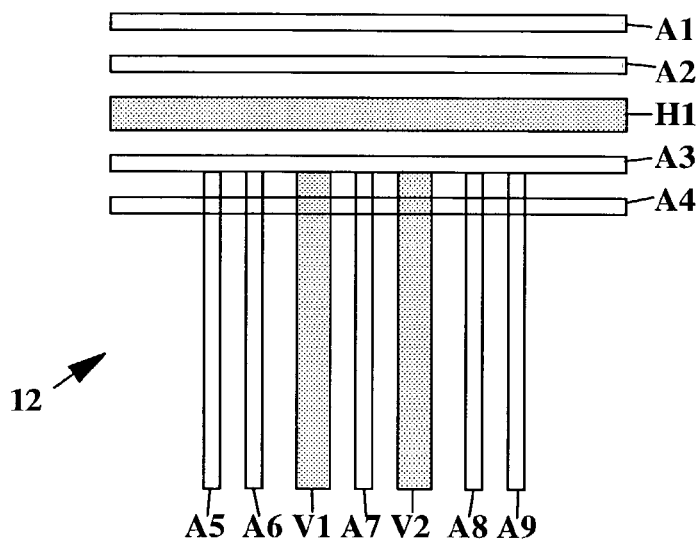
FIG. 2 shows a photolithograpic mask patterned for printing the layout of FIG. 1 which shows that an unconstrained interpretation of the SRAF rules table can produce unacceptable results.

Rules governing the number, size, and placement of SRAF elements, as well as primary feature biasing, are derived from one-dimensional test-patterns which represent the spectrum of spacings over which critical features will have to be imaged in the IC manufacturing process as described in Mansfield et al. "Lithographic Comparison of Assist Feature Design Strategies" Proc. of SPIE, Vol. 4000, Optical Microlithography (XIII) (March 2000) p 63–76.

These SRAF rules are communicated in the process of designing integrated circuits to the EDA/CAD (Electronic Design Automation (EDA),/Computer Aided Design (CAD)) tool, which adds the SRAF elements to an existing chip layout, by means of a table such as TABLE I below which is similar to a table on page 658 of the paper of Liebmann et al. "TCAD Development for Lithography Resolution Enhancement" IBM J. RES. DEV. VOL. 45, No. 5, September 2001 pages 651–665 which shows an illustrative example of a partial SRAF rules table. The SRAF rules table lists the desired number, size, and placement of SRAF elements, as well as main feature biasing as a function of primary feature spacing. Several rows in TABLE I are marked with the tilde "~", which indicates that ranges of table entries have been eliminated from the complete SRAF TABLE for convenience of explanation. The only variable governing the number, size, and placement of the SRAF elements is the primary feature spacing (in some cases, primary feature width is also taken into account, but affects primary feature bias only, not the SRAF parameters). Note that the edge bias is lower 8.75 when TABLE I calls for more SRAFs, i.e. 2, 3 or 4 SRAFS whereas the edge bias is maximum 43.75 nm for 0 SRAFS with a spacing of 437.5 nm.

TABLE I

| Line Width (nm) | Spacing (nm) | Edge Bias (nm) | # of SRAF Elements | SRAF Width (nm) | Inner SRAF Placement (nm) | Outer SRAF Placement (nm) |
|---|---|---|---|---|---|---|
| 175 | 245 | 26.25 | 0 | | | |
| ~ | | | | | | |
| 175 | 437.5 | 43.75 | 0 | | | |
| 175 | 455 | 17.5 | 1 | 78.75 | 315 | |
| ~ | | | | | | |
| 175 | 577.5 | 26.25 | 1 | 87.5 | 376.25 | |
| 175 | 595 | 8.75 | 2 | 65.63 | 277.81 | |
| ~ | | | | | | |
| 175 | 822.5 | 8.75 | 2 | 70 | 286.56 | |
| 175 | 840 | 8.75 | 3 | 65.63 | 260.31 | 507.5 |
| ~ | | | | | | |
| 175 | 1,032.5 | 8.75 | 3 | 74.38 | 286.56 | 603.75 |
| 175 | 1,050 | 0 | 4 | 65.63 | 260.31 | 461.56 |
| ~ | | | | | | |
| 175 | 1,225 | 8.75 | 4 | 74.38 | 277.81 | 492.19 |

Parameters
Line Width (nm) . . . width of primary feature (feature receiving assist feature)
Spacing . . . space of primary feature edge which is receiving assist feature element to its neighbor
Edge Bias (nm) . . . feature size correction (per edge) applied to primary feature
# of SRAF Elements . . . number of assist features which need to be added for a given primary feature space
SRAF Width (nm) . . . Width of SRAF feature elements that is/are being added
Inner SRAF Placement (nm) . . . position of assist feature closest to primary feature
Outer SRAF Placement (nm) . . . position of assist feature farther away from primary feature There are two observations regarding TABLE I and SRAF rules in general, that are important to make at this point, which are as follows:

1) The large 'Edge Bias' for unassisted line widths (top two entries in the SRAF TABLE I) illustrate the significant amount of overexposure typical for an optimized SRAF lithography process. i.e. the maximum obtainable process window exists at a point where features on the photo mask are biased larger and the exposure dose is set higher than nominal to compensate for this feature biasing for opaque SRAF elements, (the opposite is true for clear SRAF elements).

2) Features for which the SRAF rules indicate one or more SRAF elements, in most cases, obtain much less primary feature biasing than assisted features, i.e. for assisted feature spacings, the edge bias applied to the primary feature is relatively small.

A considerable challenge in the layout design of SRAF elements is presented by the need to add SRAF elements, which were optimized for one-dimensional test-structures, to two-dimensional chip layouts.

As stated above, Liebmann et al. "Optimizing Style Options for Sub-Resolution Assist Features," in Proc. SPIE, vol 4346, SPIE, 2001 describes how SRAF style options are used to fine-tune the behavior of SRAF elements in complex two-dimensional layout situations. The goal in enhancing lithographic process window is to ensure that every critical edge receives a corresponding assist feature.

Figure 4:
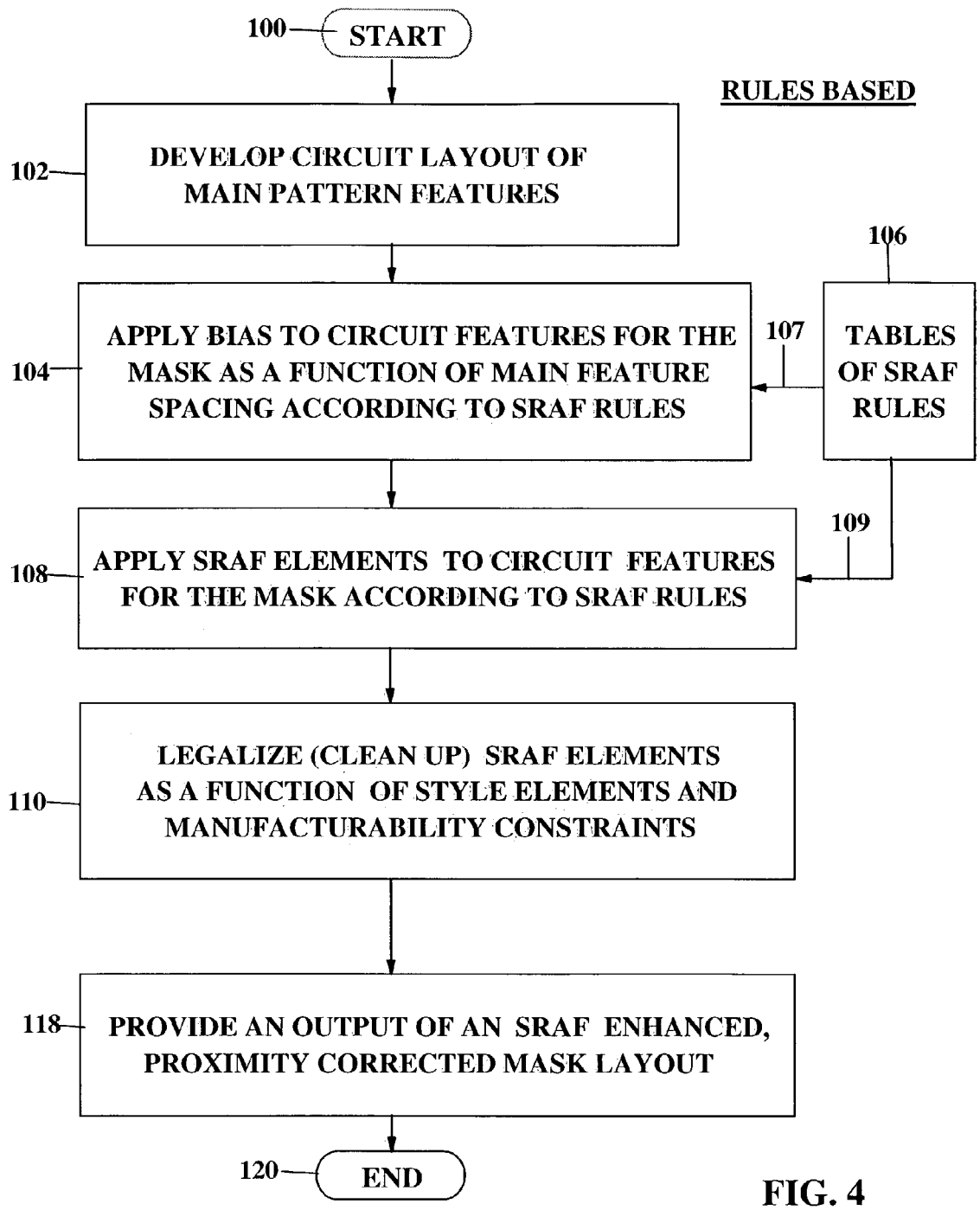
FIG. 4 is a flow chart based upon a completely Rules-Based SRAF approach to designing a photolithographic mask in which primary feature biases and assist features are applied based on primary feature spacing directly from SRAF rules.
Figure 5:
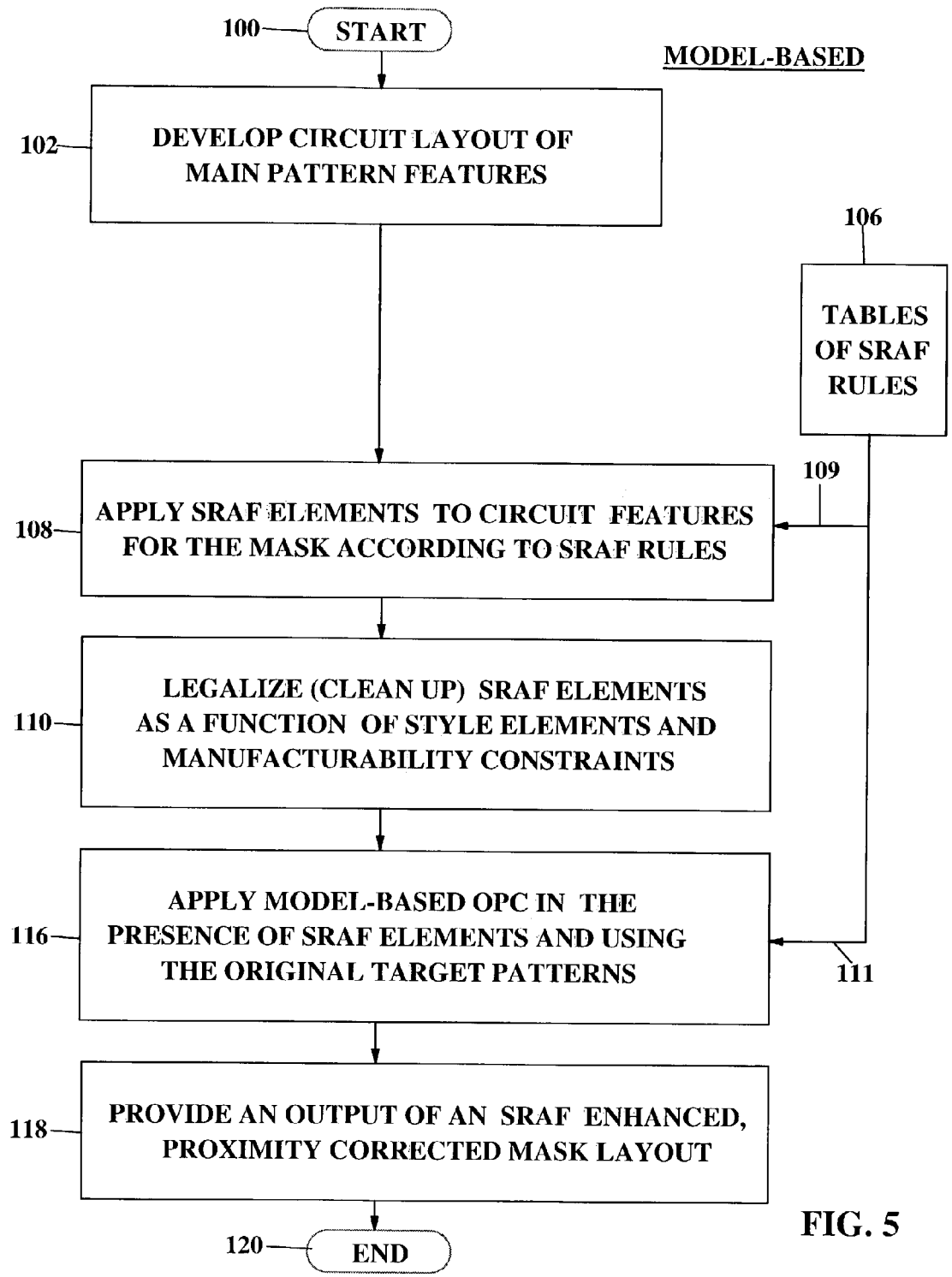
FIG. 5 is a Model-based SRAF flow chart for generating SRAF features only from rules, with main feature bias being applied by iterative model-based OPC.

FIG. 4 shows a Rules-Based SRAF process flow chart and FIG. 5 shows a Model-Based SRAF process flow chart, respectively for generating SRAF-enhanced mask designs from existing circuit layouts such as the layout 10 in FIG. 1. The Rules-Based SRAF process flow chart of FIG. 4 is arranged for side-by-side comparison with the enhanced Rules-Based process illustrated by FIG. 8. The Model-Based SRAF process flow chart of FIG. 5 is arranged for side-by-side comparison with the enhanced Model-Based flow chart illustrated by FIG. 9, as well as the flow chart of FIG. 4.

Rules-Based SRAF

The flow chart shown in FIG. 4 is based upon a completely Rules-Based approach to designing a photolithographic mask in which primary mask feature biases as well as assist features are applied based on primary feature spacing directly from a rules table, which are illustrated by TABLE I above.

As shown in FIG. 4, the SRAF elements cleanup (block 110) is a step in the design process and ensures manufacturable and lithographically safe SRAF designs. The Rules-Based SRAF elements flowchart of FIG. 4 incorporates main feature sizing as part of the SRAF design.

The program START begins with step 100 which leads to step 102 in which the data processing system develops a circuit layout of main pattern features of a chip that are input into the CAD system that includes;(as will be well understood by those skilled in the art) a data entry unit such as a keyboard, a Central Processing Unit (CPU) and a Data Storage Device (DSD), e.g. a hard drive, inter alia.

Next in step 104, the function is to apply bias to the circuit features for the mask as a function of main feature spacing according to the SRAF rules stored in tables 106 of SRAF rules (stored in the DASD) as indicated by line 107 from the tables of SRAF rules 106 to step 104. The rules in tables 106 relate to the placement of SRAF elements adjacent to main pattern features such as horizontal pattern bar H1 and vertical pattern bars V1/V2 as a function of the SRAF rules. The SRAF rules in the SRAF rules table relate to sizes and placement of SRAF elements, as well as biasing of the main pattern features to compensate for proximity effects as a function of spacing of the main pattern features.

Then in step 108, the system applies SRAF elements (features) to the circuit features for the mask according to SRAF rules supplied to the system from the DASD as indicated by line 109 extending from the tables of SRAF rules 106 to step 108.

Next, in step 110 the system legalizes (cleans up) the SRAF elements as a function of factors which in this case include style options and manufacturabiltiy constraints as indicated by the discussion of "Hierarchical prioritization" as described in Liebmann et al. "Optimizing Style Options for Sub-Resolution Assist Features", supra.

Then in step 118 the CAD system provides an output of an SRAF enhanced, proximity corrected mask layout, and finally in step 120, the "Rules-Based SRAF Flow" reaches the END.

Model-Based SRAF

As an alternative to the process of FIG. 4, a modified Rules-Based SRAF design can also be combined with conventional model-based Optical Proximity Correction (OPC), as shown in the flowchart of FIG. 5.

In model based OPC, a target pattern to be formed at the wafer is provided as input to a simulation model of the lithographic process. Using an initial mask layout as input, the model simulates the image formed at the wafer plane. The image could be any wafer image such as an aerial, a latent image in resist, or an etched pattern. The model based OPC tool compares the simulated image to the target image and computes errors in critical feature sizes. These errors are used to modify and bias the critical features of the mask layout, and then the simulation and compare steps are repeated until the errors in critical feature sizes no longer excede a tolerance value. This yields a final modified mask layout having appropriately biased primary features.

The flow chart of FIG. 5 shows that a modified rules-based SRAF design can be combined with conventional model-based OPC. FIG. 5 includes Model-Based OPC step 116 in the flow chart, while omitting the step 104 of applying feature bias as a function of main feature spacing by skipping to step 108 instead. In this model-based SRAF design Flow Chart, only the SRAF elements size and placement is directly transferred to the Computer Assisted Design (CAD) layout. The main feature biasing information is communicated to the model-based OPC tool by means of adjusting the simulated exposure dose appropriately. Main feature mask bias is then applied by iterative model-based OPC. The iteration occurs internally within the model-base OPC function shown in step 116.

The program START begins with step 100 which leads to step 102. In step 102, the data processing system develops a circuit layout of main pattern features of a chip that are input into the CAD system that includes a data entry unit such as a keyboard, a CPU and a DSD, e.g. a hard drive, inter alia.

Then in step 108, the system applies SRAF elements to the circuit features for the mask according to SRAF rules stored in tables 106 and supplied to the system from the DASD as indicated by line 109 extending from tables of SRAF rules 106 to step 108. The table of SRAF rules are discussed above in connection with FIG. 4.

Next, in step 110 the system legalizes "cleans up" the SRAF elements as a function of style elements and manufacturabiltiy constraints as indicated by the discussion of "Hierarchical prioritization", described in Liebmann et al. "Optimizing Style Options for Sub-Resolution Assist Features", supra, which is incorporated herein by reference.

The following step 116, which is the recursive Model-Based OPC method, is applied in the presence of SRAF elements and using the original target patterns. The original target patterns may be stored in the SRAF tables in block 106 supplied to step 116 on line 111 from the DASD storage device where the SRAF tables are stored. As is well understood by those skilled in the art the Model-Base OPC method repeats its modeling of patterns recursively until it appears that a satisfactory result will be obtained. The Model-Based OPC method is described in Liebmann et al. "TCAD Development for Lithography Resolution Enhancement", supra. Also, see Liebmann et al. "Optimizing Style Options for Sub-Resolution Assist Features", supra which also discusses Model Based OPC.

The Model-Based OPC subroutine of the program simulates an image expected from a pattern simulating a latent image in the photoresist or another image (areal or the like) and provides feature biasing to correct for proximity effects. The subroutine performs the functions as follows:

(1) comparison of the simulated pattern with a desired pattern.
(2) As a result of the comparison if an error is detected the program generates an error signal, and modifies the mask pattern to compensate for the error.
(3) the step 116 returns to the beginning of step thereof
(4) the system repeats function (1),
(5) the system repeats function (2),
(6) when no error is detected, step 116 is stopped for the given feature. The system repeats step 116 for various other locations.

Then in step 118 the CAD system provides an output of an SRAF enhanced, proximity corrected mask layout. Finally in step 120, the "Model-Based SRAF Flow" reaches the END.

Since the model-based OPC program of FIG. 5 is applied after the SRAF design and cleanup are complete, the model-based SRAF design flow can compensate, to a certain degree, for the localized SRAF-loss by appropriately modeling the reduced printed feature size, but cannot compensate for losses in process window.

Since the model-based OPC process of FIG. 5 is applied after the SRAF design and legalization (cleanup) of step 110 are complete, the model-based SRAF design flow can compensate, to a certain degree, for the localized SRAF-loss by appropriately modeling the reduced printed feature size. However, model-based OPC process in step 116 of FIG. 5 has no knowledge of the lithographic process window enhancement afforded by the SRAF, nor can it calculate or compensate for process window loss associated with localized SRAF-loss. Thus, a substantial need exists for proximity correction of SRAF features used in photolithography to be provided by a system which can calculate or compensate for process window loss associated with localized SRAF-loss.

Optimized SRAF Layout Illustrating SRAF-Loss along Critical Feature Segment

Figure 6:
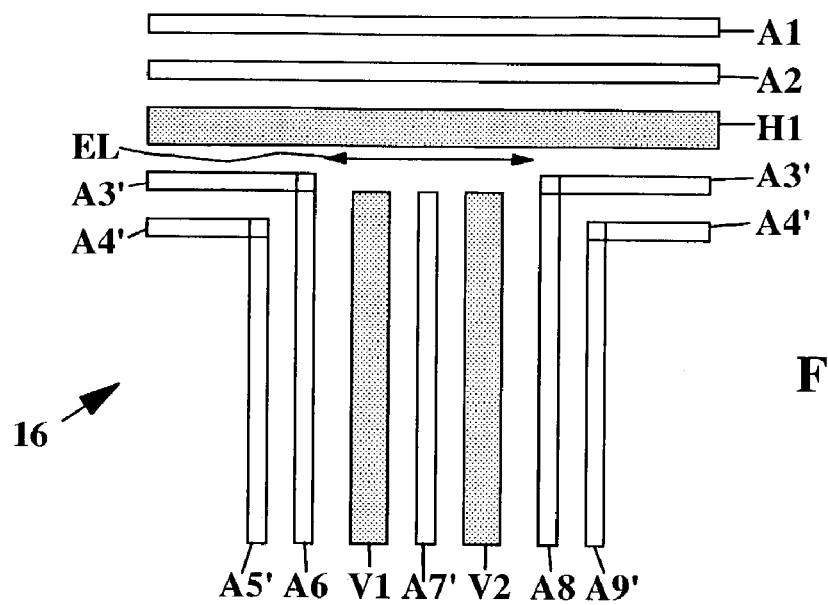
FIG. 6 is a mask layout that shows that even the most careful optimization of SRAF style options inevitably leads to layout regions in which critical feature segments are inadequately enhanced due to SRAF-loss in the cleanup process.

FIG. 6 shows a mask 16 with an optimized layout of SRAF elements that illustrates SRAF elements-loss along critical feature segment. FIG. 6, illustrates that even the most careful optimization of SRAF style options inevitably leads to layout regions in which critical feature segments are inadequately enhanced due to SRAF-loss in the cleanup process as indicated by the double arrow line EL that is located centrally below horizontal bar H1 at the top of the wider open space FM shown in FIGS. 3/6 where SRAF features are missing in FIG. 3 and there is a loss of shading because there are no assist features in the space FM in FIG. 3. This is an area in which the program should provide a biasing or widening of the pattern on the mask because the space filled by the arrow EL with no SRAFs to provide assistance will tend to narrow or neck down the lower edge of line H1. The problem edge segment EL is determined by analyzing the cleanup mask layout of FIG. 3 in a manner similar to that described with reference to FIG. 1. Note that edge segments that are too short (such as segments B, C and D from FIG. 1) are merged into one segment due to constraints similar to those provided in a cleanup algorithm (see block 110).

In the rules-based design flow, the region of SRAF-loss marked by double arrow line EL in FIG. 6 represents a critical feature edge that receives primary feature biasing under the assumption that the appropriate assist features will be placed in accordance with the SRAF tables. However, because of manufacturability constraints, the SRAF elements are missing for portions of that edge in the final layout.

Figure 7:
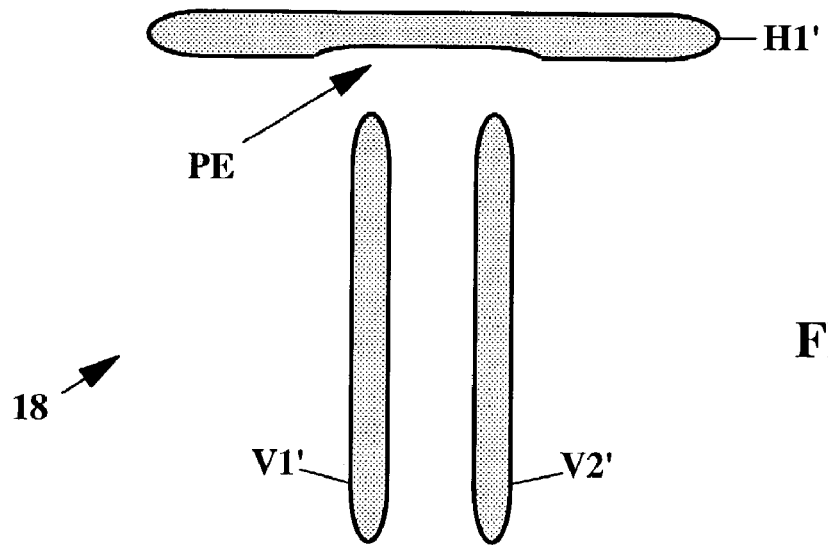
FIG. 7 shows image notching caused by SRAF elements-loss using the mask of FIG. 6.

FIG. 7 shows a print of the main feature elements H1/V1/V2 of FIG. 1 as H1'/V1'/V2' which is an example of image notching PE of horizontal bar H1' caused by SRAF elements-loss using the mask of FIG. 6 because of the absence of an SRAF in the double arrow region EL. The image notching PE is the result of such 'under-biasing' of the critical feature edge in the region of SRAF elements-loss, which causes severe image notching (i.e. localized feature width reduction in the printed patterns). In the case of a conductor such as a gate electrode of an MOSFET device this notch could cause a poor connection or increased resistance of the gate electrode. In the case of a conductor line the increased resistance could modify operating characteristics of the MOSFET device.

DESCRIPTION OF THE PREFERRED EMBODIMENTS

Binary-OPC with Rules-Based SRAF or Model-Based SRAF

Figure 8:
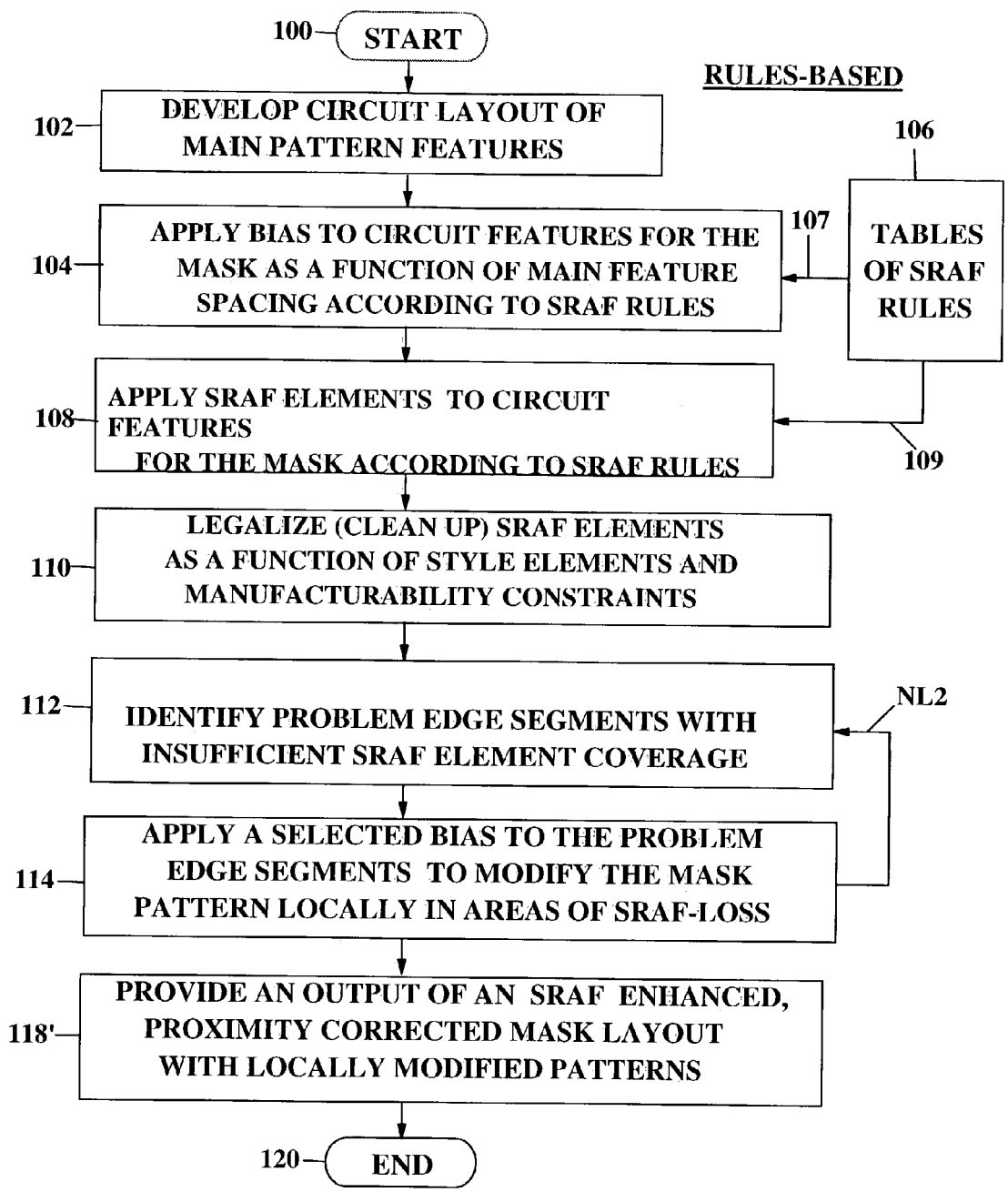
FIG. 8 is a flow chart illustrating an application of a selected bias to the problem edge segments (as in Binary OPC) of the Rules-Based SRAF elements, which incorporates main feature sizing as part of the SRAF design.
Figure 9:
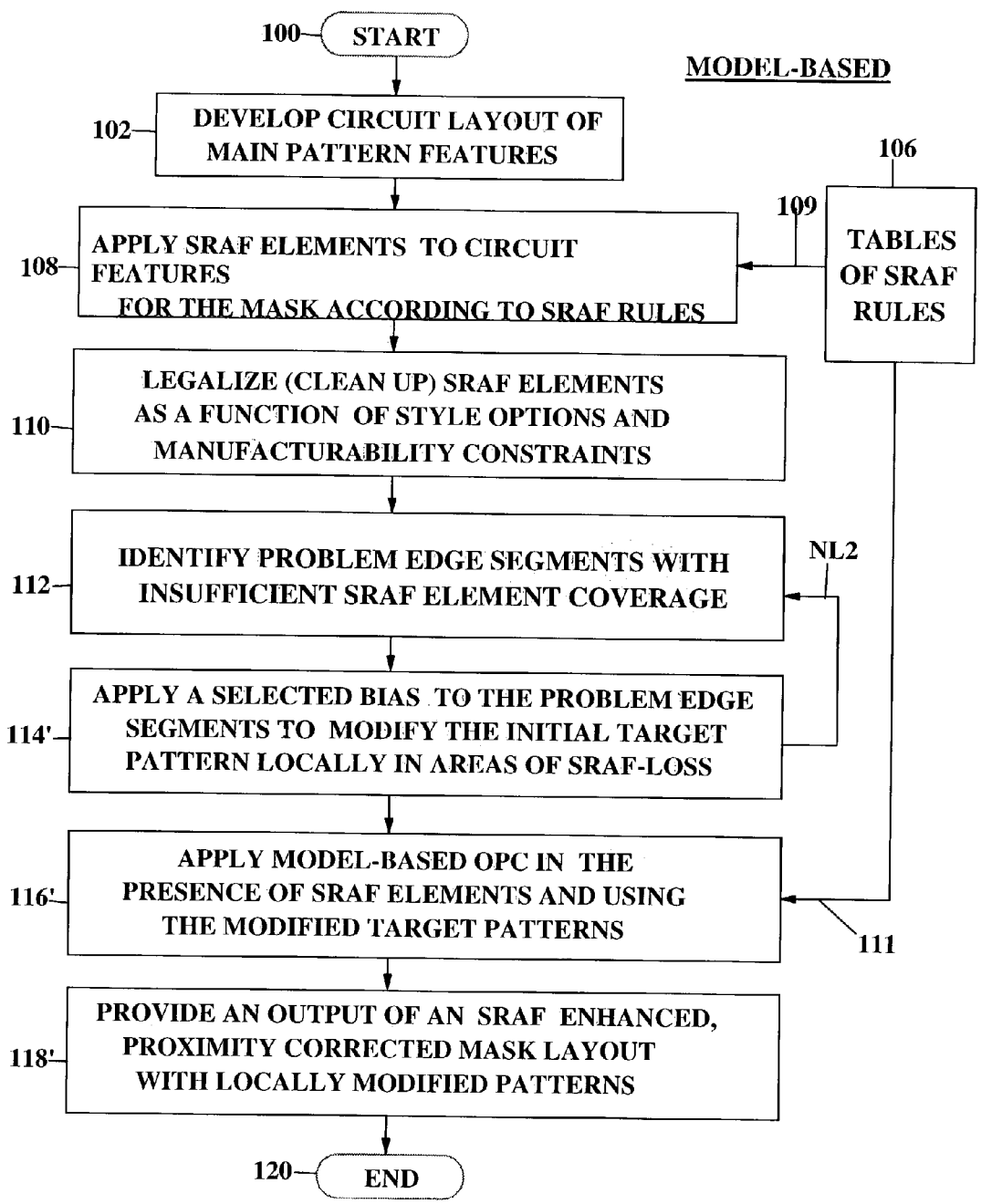
FIG. 9 is a flow chart illustrating an application of a selected bias to the problem edge segments (as in Binary OPC) of the Model-Based SRAF flow, which incorporates main feature sizing as part of the SRAF design.

The basic approach to this invention is to modify the Rules-Based process of FIG. 4 and Model-Based process of FIG. 5 by adding functions shown in the enhanced Rules-Based process of FIG. 8 and the Model-Based OPC of FIG. 9 as two new steps 112/114 and 112/114' respectively which are added to the flow charts following the "Legalized (Clean-Up) SRAF as a Function of 'Style Options'" step 110. Furthermore, a modified step 116' is employed in the Model-Based OPC of FIG. 9.

In FIGS. 8 and 9, the two new steps (collectively referred to herein as binary OPC) added to the flow charts are as follows:

1. Step 112: (FIGS. 8 and 9):

"Identify Problem Edge Segments with Insufficient SRAF Element Coverage", i.e. Identify problem/critical edge segments of the main pattern features based on insufficient SRAF element coverage) and 2. Step 114 (FIG. 8):

"Apply a selected bias to the problem edge segment to modify the mask pattern locally in areas of SRAF-loss"; or Step 114' (FIG. 9):

"Apply a selected bias to the problem edge segments to modify the initial target pattern locally in areas of SRAF-loss".

Figure 3:
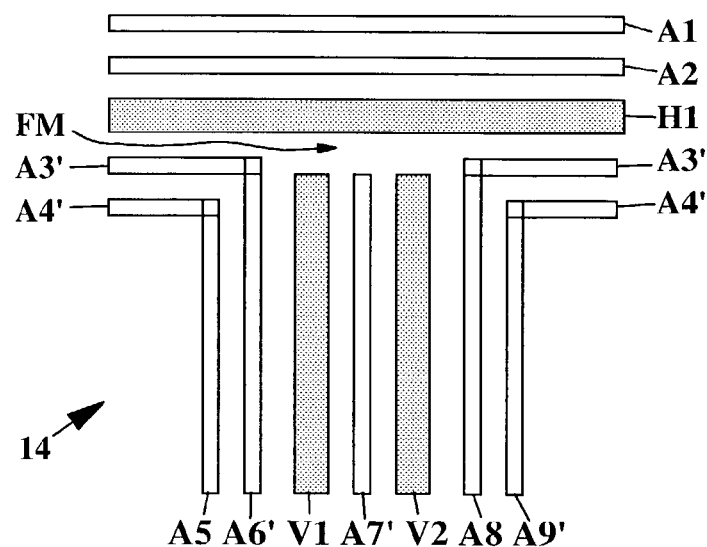
FIG. 3 shows a photolithograpic mask modified from the mask of FIG. 2 which is patterned for printing the layout of FIG. 1 with an optimized pattern of the SRAF elements which can produce mask patterns which are manufacturable under some circumstances.
Figure 13:
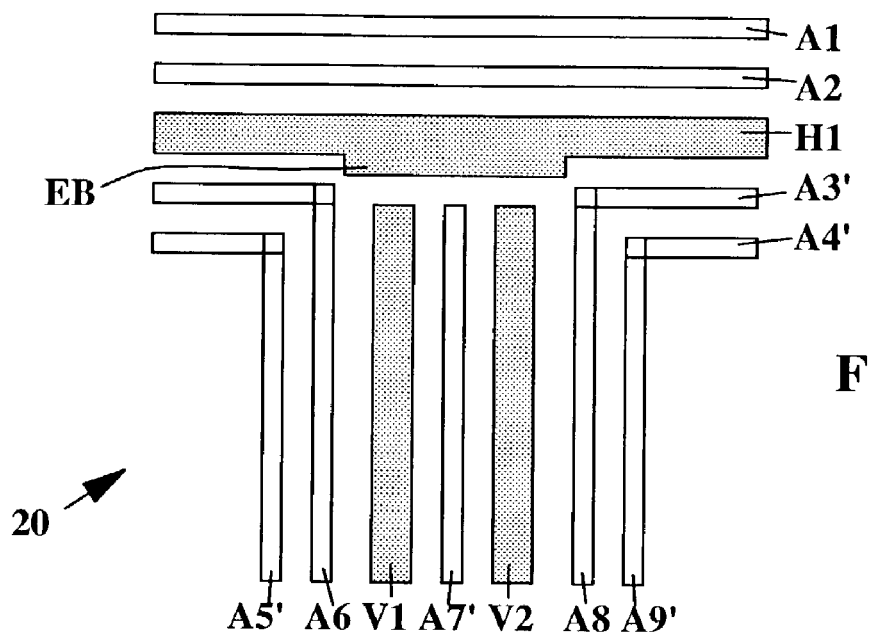
FIG. 13 shows a photolithograpic mask pattern which is a modification made in accordance with this invention of the pattern of FIG. 3 patterned to print the layout of FIG. 1 with an optimized pattern of the SRAF elements which can produce mask patterns which are manufacturable with improved results.

FIG. 13 shows a photolithograpic mask pattern, which is a modification in accordance with this invention of the pattern of FIG. 3, patterned to print the layout of FIG. 1 with an optimized pattern of the SRAF elements and a widened primary feature which can produce mask patterns which are manufacturable with improved results. FIG. 13 shows a modified mask 20, modified from mask 14 in FIG. 3, which includes a biased portion EB along the identified problem edge segment EL in accordance with the present invention. The horizontal bar H1 has been biased (widened) on top of the space FM in FIG. 3 to leave an acceptable maximum spacing between bar H1 and bars V1/A7/V2 therebelow to assure a robust image of the bar H1 when it is printed, without the risk of narrowing where the SRAFs had been removed in the legalization process.

Figure 14:
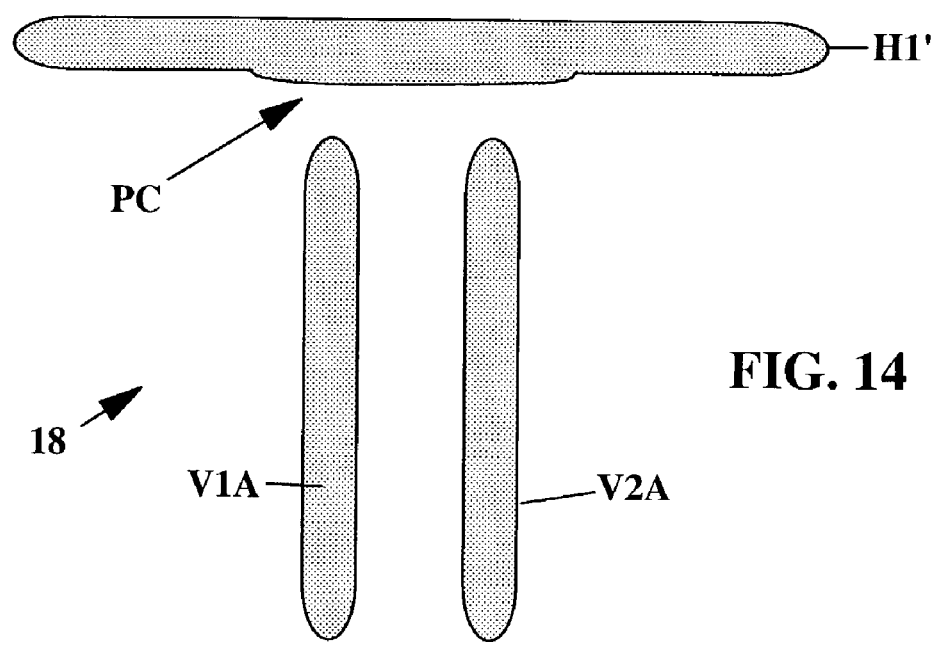
FIG. 14 shows a print of the pattern produced using the mask of FIG. 13 with the widened feature on the lower edge of the horizontal bar.

FIG. 14 shows a print of the pattern produced using the mask of FIG. 13 with the widened feature PC on the lower edge of the horizontal bar H1'. The resulting image shown in FIG. 14 insures that the problem edge segments PC will tend to print wider and will not print to narrowly (pinch down). Note that the ends of the horizontal bar H1' and vertical bars V1A/V2A are rounded and that the spacings between the three bars fall within the maximum acceptable spacing parameter.

First Embodiment of the Invention

Rules-Based Binary-Optical Proximity Correction (OPC) with SRAF

FIG. 8 is a flow chart illustrating an application of Binary OPC steps to the Rules-Based SRAF elements, which incorporates main feature sizing as part of the SRAF design, which is a modification of the flow chart of FIG. 4, with the addition of steps 112 and 114. As in FIGS. 4 and 5, the program START begins with step 100 which leads to step 102. In step 102, the first data processing system develops a circuit layout of main pattern features of a chip that are input into the CAD system that includes a data entry unit such as a keyboard, a CPU and a DSD, inter alia. The steps 102, 104, 108 and 110 as well as rules table 106, are identical to those described above in connection with the Rules Based SRAF process described with reference to FIG. 4.

The first new step of the method of this invention is step 112 in which the system identifies problem (critical) edge segments of a main pattern feature based upon insufficient SRAF element coverage to avoid the risk of a defect in printing. Step 112 comprises a rules based process for identifying each edge at risk of defective printing, in which the system identifies a problem edge segment at risk, i.e. an edge which has a proximity error which needs to be corrected because the space between adjacent edges exceeds the spacing at which one or more SRAF bars should be added to avoid a printing error. In step 112, the CAD system must apply rules to determine which edges of which pattern features and which SRAF elements of the current design of the mask being developed by the CAD system are at risk of being spaced too far apart and therefore require performance of the proximity correction function of this invention. Thus in step 112, the CAD system identifies such an edge and provides an output to the next step 114.

Figure 10A:
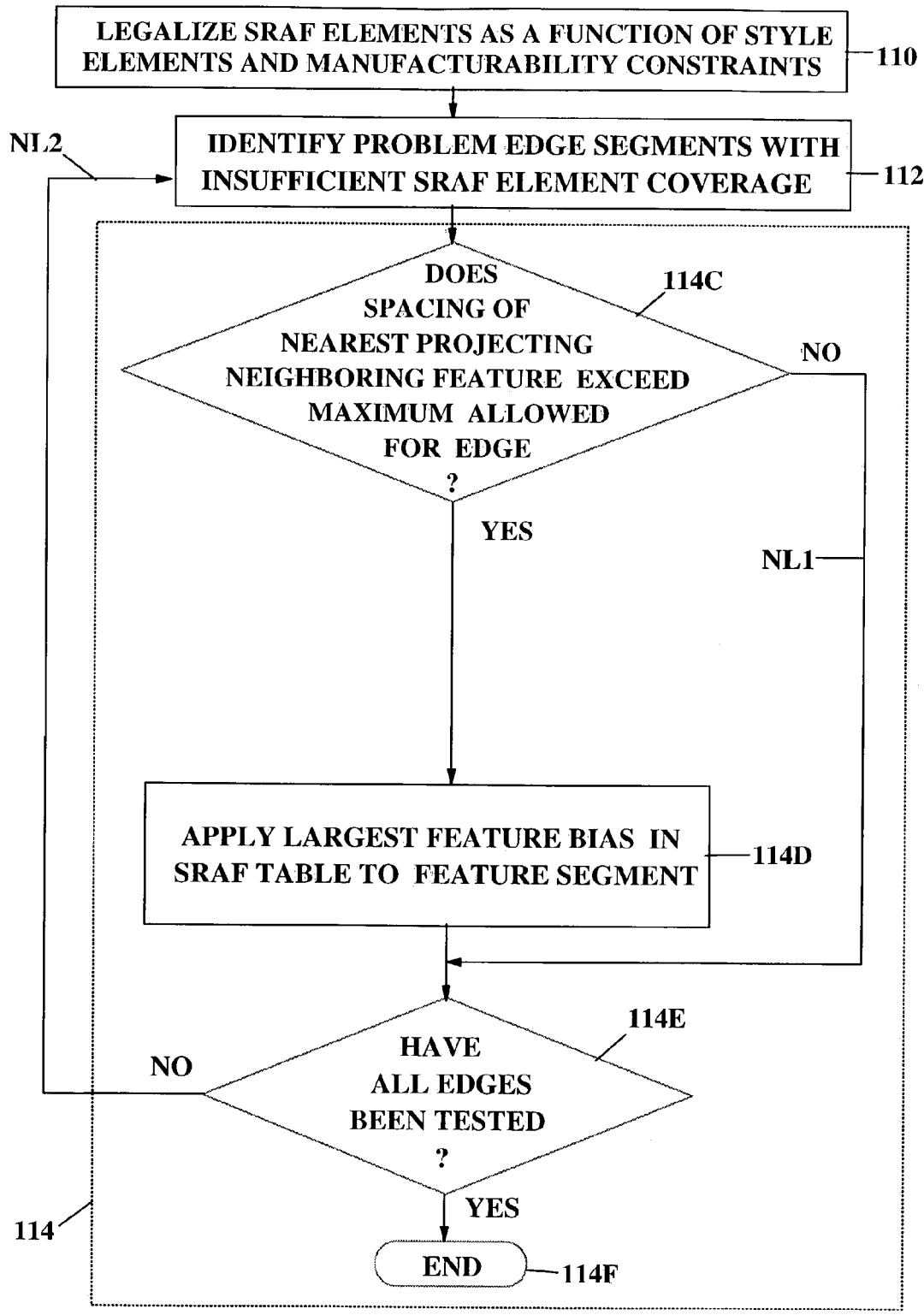
FIG. 10A is a flow chart of a subroutine for application of a selected bias to problem edged segments in accordance with this invention which is applied to enlarge portions of a mask to improve lithographic performance.
Figure 10B:
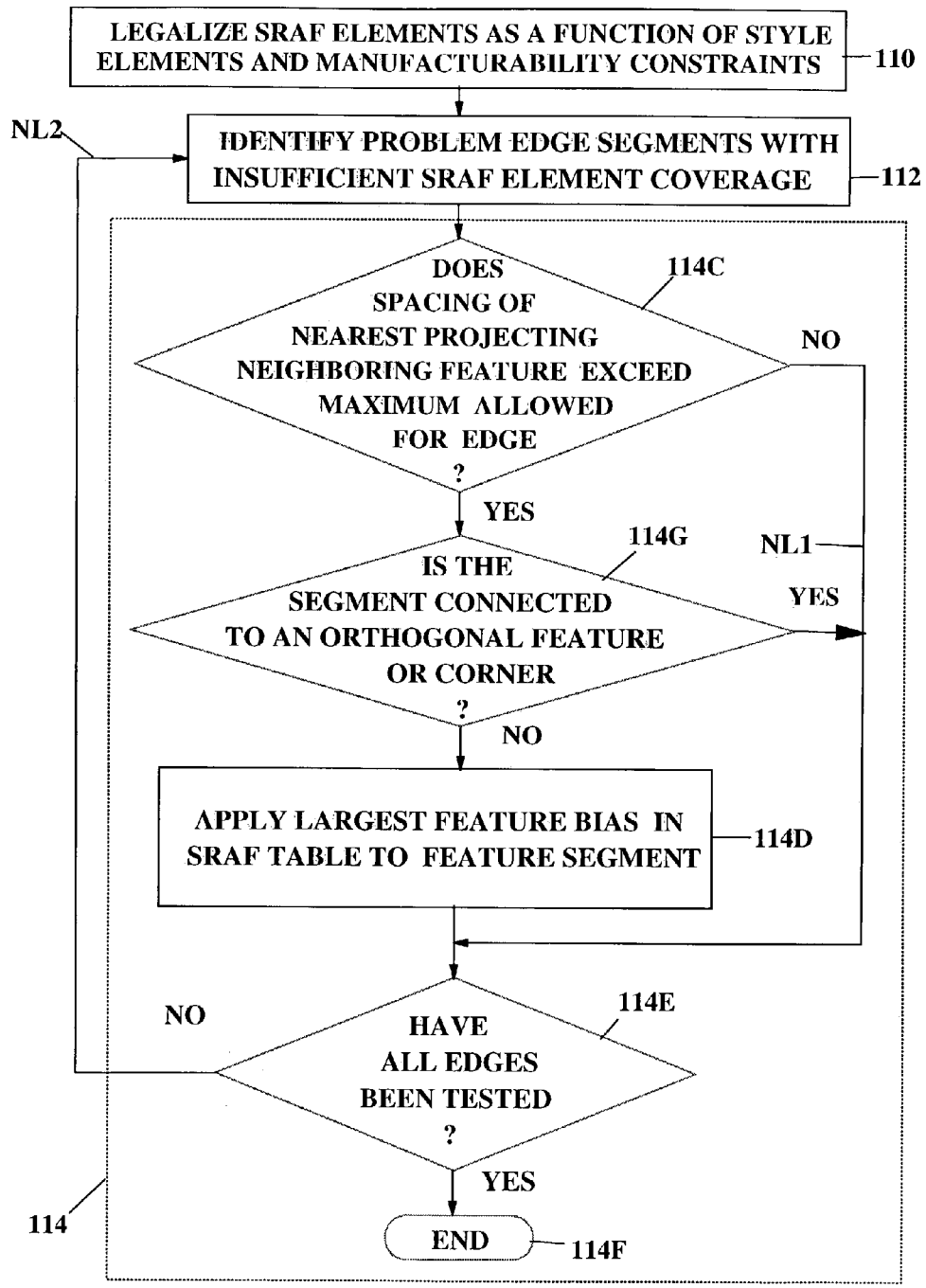
FIG. 10B is a flow chart of a modification of the subroutine of FIG. 10A for application of a selected bias to problem edged segments in accordance with this invention which is applied to enlarge portions of a mask to improve lithographic performance, where a step of determining whether a segment is connected to an orthogonal feature or a corner.

Step 114 is a simplified rules-based step which is the second new step of this invention. In step 114, "Apply a selected bias to the problem edge segments to modify the mask pattern locally in areas of SRAF-loss" a secondary rules-based proximity correction step is performed. Step 114 locates critical feature edges that are lacking SRAF elements and compensates for the SRAF elements-loss by providing a bias by expanding the width of a localized feature. That is to say that step 114 increases the primary feature size along the identified problem edge segment, in areas of SRAF-loss. FIGS. 10A and 10B, which show flow charts illustrating alternative versions of the subroutines 114/114' of the flow charts of FIG. 8 and FIG. 9, are described in greater detail below.

Then in step 118' the CAD system provides an Output of an SRAF enhanced, proximity corrected mask layout with locally modified mask patterns to recover the lithographic process window in areas of SRAF element loss.

Finally in step 120, the "Rules-Based SRAF Flow" reaches its END.

Second Embodiment of the Invention

Model-Based Optical Proximity Correction (OPC) with SRAF

FIG. 9 is a flow chart illustrating a Binary OPC implementation in the Model-Based SRAF elements flow chart of FIG. 5. In FIG. 9 a modified step 114' based on the selective bias step 114 of FIG. 8 is applied to the Model-Based SRAF flow chart of FIG. 5. As in FIGS. 4, 5 and 8, the START step 100 leads to step 102. The steps 102, 108 and 110 as well as the table of SRAF rules 106, are the same as in FIG. 5 and step 112 which is the same as in FIG. 8 follows step 110 as in FIGS. 5 and 8. The process of FIG. 9 omits the step 104 of FIGS. 4/8 and performs the step 108 in place thereof.

In step 112, the CAD system must apply rules to identify the problem edge segments of the main pattern features based upon insufficient SRAF element coverage, i.e. which SRAF elements of the current design of the mask being developed by the CAD system are at risk of being spaced too far apart and therefore require performance of the proximity correction function of this invention. Thus in step 112, the CAD system identifies such an edge and provides an output to the next step 114'.

Step 114', which follows step 112, is a simplified rules-based step which is the second new step of this invention. In step 114', "Apply a selected bias to the problem edge segments to modify the initial target pattern locally in areas of SRAF-loss" a secondary rules-based proximity correction step is performed. Step 114' locates critical feature edges that are lacking SRAF elements and compensates for the SRAF elements-loss by providing expansion of a localized feature of the initial target pattern along the problem edge segments. That is to say that step 114' increases the primary feature size in areas of SRAF-loss in the target pattern. Thus the image simulated by the pprocess model will be compared to a biased target pattern to insure that the output mask is robust and will not print too narrow along the problem edge segments. FIGS. 10A and 10B, which show flow charts illustrating alternative versions of the subroutines 114' of the flow charts of FIG. 9, are described in greater detail below.

After step 114', the flow chart of FIG. 9 includes a modified Model-Based OPC step 116' based on step 116 in FIG. 5. Step 116', which is the recursive Model-Based OPC method, is applied in the presence of SRAF elements and uses the modified target patterns (not the original target patterns as in the embodiment of FIG. 8), as dictated by SRAF tables in block 106 supplied to step 116 on line 111 from the DASD storage device where the SRAF tables are stored. As is well understood by those skilled in the art the Model-Base OPC method repeats its modeling of patterns recursively until it appears that a satisfactory result will be obtained. The Model-Based OPC method is described in Liebmann et al. "TCAD Development for Lithography Resolution Enhancement", supra. Also, see Liebmann et al. "Optimizing Style Options for Sub-Resolution Assist Features", supra which also discusses Model Based OPC. The FIG. 9 SRAF elements are generated using rules, main feature bias, which is applied by iterative model-based OPC.

Then in step 118' the CAD system provides an output of an SRAF enhanced, proximity corrected mask layout with locally modified primary features to insure that the problem edges will not print too narrowly in areas of SRAF element loss.

Finally in step 120, the "Model-Based SRAF Flow" reaches the END.

Binary OPC

FIG. 10A is a flow chart of Binary OPC 112 and 114/114' applied in accordance with this invention to enlarge portions of a mask to improve lithographic performance. In FIG. 10A after cleanup 110 in FIG. 8 and FIG. 9, the binary OPC process 112 and 114/114' begins with step 112.

In step 112, the system 114/114' identifies each problem edge of a feature, one a time using an algorithm similar to that described with reference to FIG. 1.

In step 114C, a test is made as to whether the problematic edge segment is spaced from the nearest projecting neighboring feature (primary-or assist feature) that exceeds the maximum allowable spacing according to the SRAF rules table. The maximum spacing value is derived from the larger of either the largest unassisted feature spacing or the largest inner assist feature placement.

If the answer to the test in step 114C is YES, the binary OPC system proceeds to step 114D where the CAD system applies the largest feature edge bias called for in the SRAF table (TABLE I) to the feature edge segment in question which would be 43.75 nm. Then the system proceeds to step 114E.

Alternatively, if the result of the test in step 114C is NO, the system proceeds from step 114C directly to step 114E, bypassing step 114D.

In step 114E, the CAD system tests whether all critical edges of a feature have been tested. If the answer is NO, the Binary OPC subroutine returns to step 112 and repeats the cycle through the subroutine until the result of the test in step 114E is a YES answer. If YES, the Binary OPC subroutine proceeds to the END in step 114F.

The goal of binary OPC in the model-based SRAF design flow is to widen the target shape locally, i.e. the reference shape used by the iterative model based OPC tools to arrive at an ideal mask shape. The object of this localized widening is, again, to compensate for the lithographic performance of the feature segment despite the lack of enhancement by. SRAF elements, and insure that the problem segment does not print too narrowly or pinch out altogether.

An alternative to the subroutine of FIG. 10A is shown in FIG. 10B with a new test 114G following a YES answer to the test 114C. In step 114G, the program tests whether the segment being considered is connected to either an orthogonal feature or a corner. If the answer is YES, then the program goes directly to test 114E, but if the segment is a corner or orthogonal, then the answer is NO and the test goes to step 114D to apply the largest feature bias in the SRAF table to the feature segment.

Figure 11:
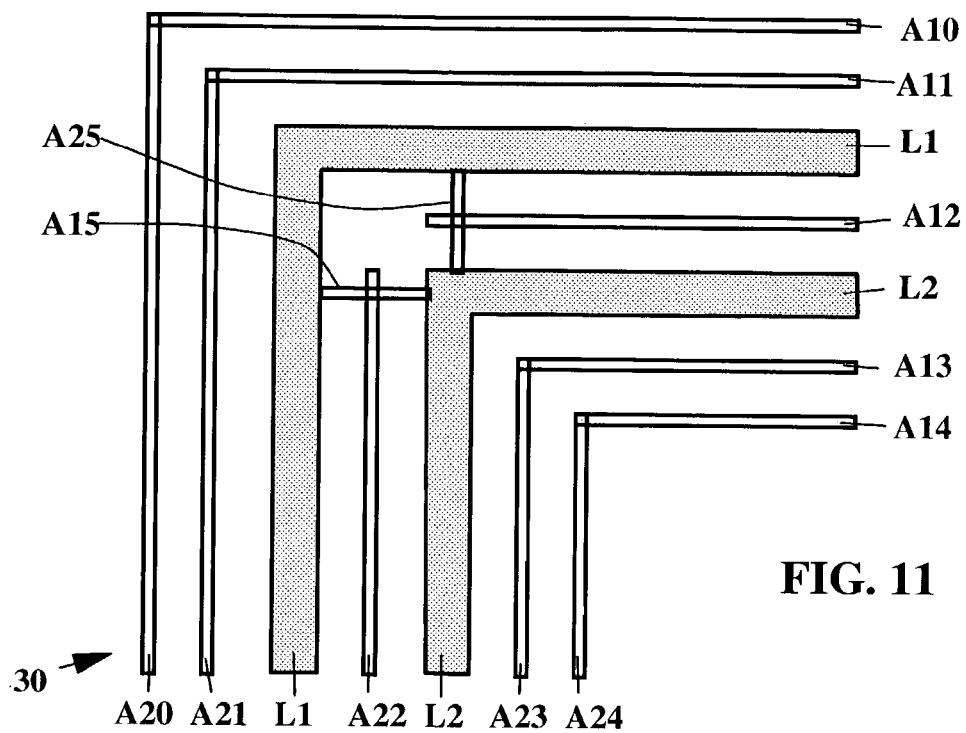
FIG. 11 shows a pair of L-shaped pattern features with SRAF elements including overlapping corner SRAF elements illustrating how SRAF elements might be placed without the enhanced features of this invention with SRAF elements crossing in a manner which may print unwanted elements between the L-shaped pattern features.

FIG. 11 shows an example of a two-dimensional layout 30 of a pattern to be exposed and printed photolithographically a further detail of this invention. In particular, FIG. 11 shows primary features targeted for SRAF shaded elements including two nested L-shaped bars L1/L2 rotated 90 degrees clockwise. The L-shaped bar L1 and relatively closely spaced parallel L-shaped bar L2, on the upper left and on the lower right respectively include legs which extend to the right and downwardly.

Above L-shaped bar L1, two horizontal SRAF elements A10/A11 are shown parallel with the horizontal leg of bar L1. Similarly, below the horizontal leg of L-shaped bar L2, two horizontal SRAF elements A13/A14 are shown parallel with the horizontal leg of bar L2. A horizontal SRAF element A12 is shown in parallel between the horizontal legs of bars L1/L2, ending at the upper/left corner of bar L2. A short horizontal SRAF element A15 is shown extending parallel to the horizontal leg of bar L1 between the vertical legs of L-shaped bars L1/L2, near the upper left corners thereof reaching between the corner of leg L2 and the vertical leg of bar L1 crossing over vertical SRAF element A22 near the upper end thereof.

To the left of L-shaped bar L1, two vertical SRAF elements A20/A21 are shown parallel with the vertical leg of bar L1. Similarly, to the right of the L-shaped bar L2, two vertical SRAF elements A23/A24 are shown parallel with the vertical leg of bar L2. A vertical SRAF element A22 is shown in parallel between the vertical legs of bars L1/L2, ending at the upper left corner of bar L2, and crossing slightly over the end of bar A15. A short vertical SRAF element A25 is shown extending parallel to the vertical leg of bar L1 between the horizontal legs of L-shaped bars L1/L2, near the corners thereof reaching between the upper left corner of leg L2 and the horizontal leg of bar L1, crossing over horizontal SRAF element A12 near the left end thereof FIG. 11 shows a pair of L-shaped pattern features with SRAF elements including corner SRAF elements which illustrates the kind of feature to which FIG. 10B is directed. The cleanup step 110 would recognize that the SRAFs shown with bars A15 and A25 crossing over features A12 and A22 and contacting the bars L1 and L2 would tend to cause unwanted images to be printed because of the excessive concentration of SRAFs between the corners and cleanup the crossing SRAF features A12/A25 and A15/A22. The unconstrained binary OPC (of FIG. 10A) would bias the problem edge segment in the corner of feature L1 and add biased feature LF as shown in FIG. 12A.

It is well known to those skilled in the art that corners have a tendency to round in the lithography process, effectively adding area to the printed image in inside corners. The widely accepted approach to compensate for this corner rounding is to add corner serifs as suggested by A. Starikov "Use of a Single Size Square Serif for Variable Print Bias Compensation in Microlithography: Method, Design, and Practice", pp. 34–46, SPIE Vol. 1088 Optical/Microlithography (1989), that locally cut back the mask image. By recognizing special layout configurations, such as inside corners, binary OPC can further optimize the resulting layout, in this case by not widening the region of SRAF elements loss, effectively letting the natural rounding of corner images to provide the desired bias. This widening of the rounded images (features L1 and L2) results in the pattern seen in FIG. 12B.

Figure 12A:
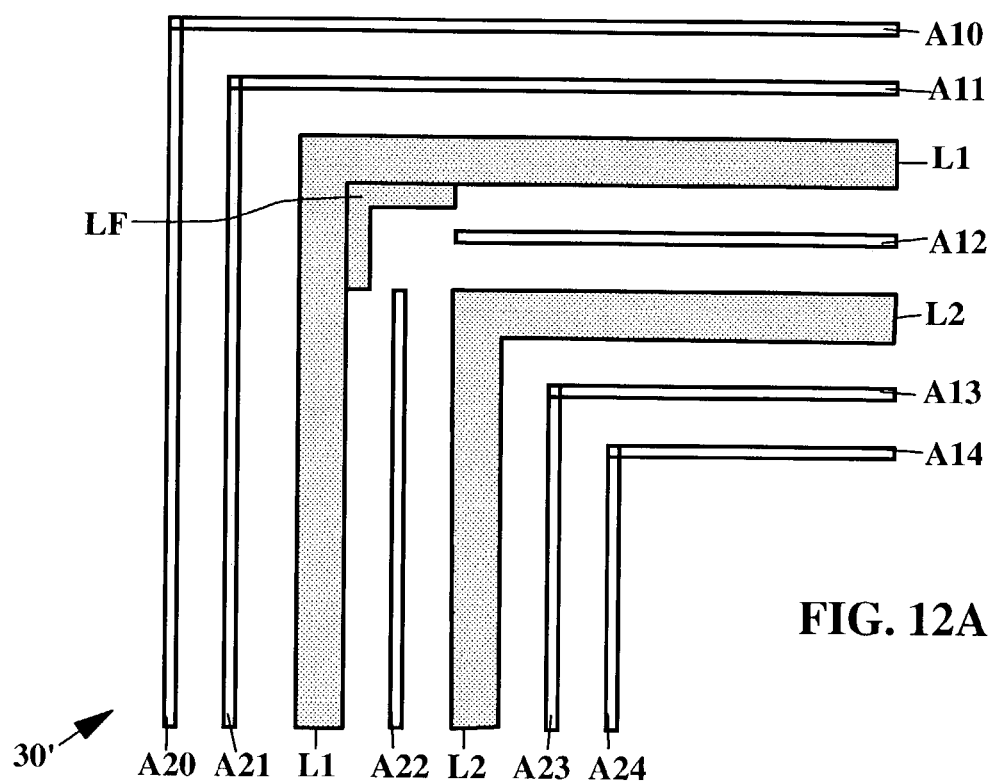
FIG. 12A shows a modification of FIG. 11 where after cleaning up the SRAFs in FIG. 11, a bias pattern in the form of small L shaped pattern has been added to the inner corner of the outer L shaped feature.
Figure 12B:
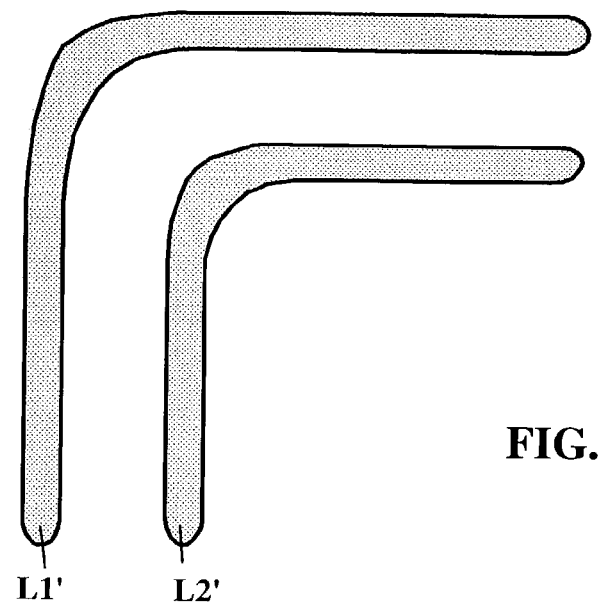
FIG. 12B shows the result of use of the pattern of FIG. 12A with the pattern features L1 and L2 rounded into pattern features L1' and L2'.

FIG. 12A shows a pattern of SRAF features formed by using step 114D in FIG. 10A would provide a selected bias to the problem edge segments at the corner by widening the L shaped pattern at the inside corner of the L-shaped pattern feature L1 of FIG. 11 in accordance with binary OPC.

Figure 12C:
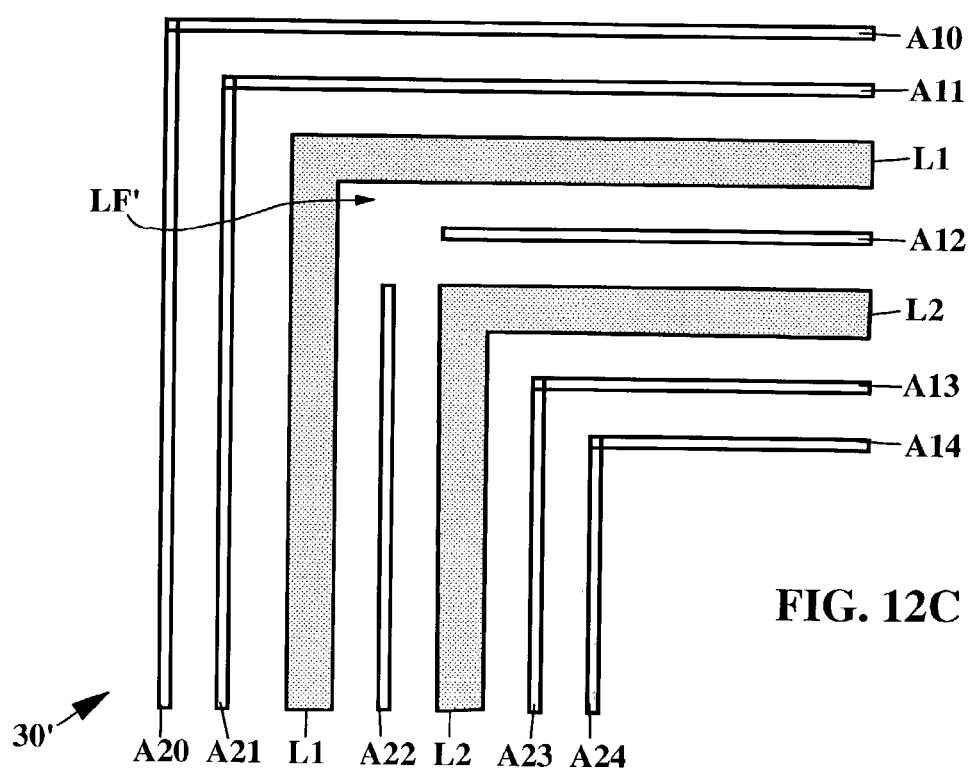
FIG. 12C shows a pattern of SRAF elements which are provided to print the L-shaped pattern features of FIG. 11 with the pattern of FIG. 11 including no feature biasing in accordance with the algorithm of FIG. 10B, but with the result of the legalization (clean up) of the overlapping SRAFs removed from the final pattern of SRAF elements.

FIG. 12C shows a legalized (cleaned up) pattern of SRAF elements which are provided to print the L-shaped pattern features L1 and L2 of FIG. 11 with the pattern of FIG. 11 including no feature biasing in accordance with the algorithm of FIG. 10B. The resulting image would print in a fashion similar to that shown in FIG. 12B which has widened corners, as desired.

This invention can be implemented on a general purpose workstation. Examples of a suitable platforms on which the invention may be implemented are disclosed in U.S. Pat. No. 5,528,508 to Phillip J. Russell and Glenwood S. Weinert for "System and Method for Verifying a Hierarchical Circuit Design", U.S. Pat. No. 5,519,628 to Phillip J. Russell and Glenwood S. Weinert for "System and Method for Formulating Subsets of A Hierarchical Circuit Design", and U.S. Pat. No. 5,481,473 to Young O. Kim, Phillip J. Russell and Glenwood S. Weinert for "System and Method for Building Interconnections in a Hierarchical Circuit Design".

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

The invention claimed is:

1. A method for forming a photolithographic mask layout with Sub-Resolution Assist Feature (SRAF) elements on a mask to improve a pattern image comprising the steps of:
 (a) developing a circuit layout comprising a plurality of features of a pattern,
 (b) providing a table of SRAF rules relating the size and placement of said SRAF elements as a function of spacing of said features of said pattern,
 (c) applying said SRAF elements to said features according to said SRAF rules,
 (d) legalizing said SRAF elements,
 (e) identifying problem edge segments of said features of said pattern based on insufficient SRAF element coverage,
 (f) applying a selected bias to said problem edge segments to modify said features of said pattern of features locally in areas of SRAF loss, and
 (g) providing an output of an enhanced mask layout with a locally modified pattern of features.

2. The method of claim 2 including using step (f) to modify said pattern of features for said mask locally in areas of SRAF loss.

3. The method of claim 1 wherein in step (f), said selected bias is applied to target features of an initial image target pattern along target feature segments corresponding to said problem edge segments, and wherein step (f) further comprises applying model-based OPC to said pattern including said SRAF elements so that said output of said enhanced mask layout is capable of forming a pattern image that substantially conforms to said modified target pattern within a specified tolerance.

4. The method of claim 1, wherein step (f) comprises:
 (h) identifying each critical edge of a feature,
 (i) testing whether an edge segment is spaced from its nearest projecting neighboring feature that exceeds the maximum allowable spacing according to said table of SRAF rules,
 (j) if the answer to the test in step (i) is YES, then proceed to step (k) if the answer to the step in test (i) is NO then proceeding to step (l),
 (k) applying a largest feature bias called for in said table of SRAF rules to the feature edge segment in question and then proceeding to step (l),
 (l) testing whether all critical edges of a feature have been tested and if a NO answer is obtained return to step (h) or if a YES answer is obtained, then end step (f).

5. The method of claim 4, wherein if the answer in step (i) is YES, then testing whether the segment in question is connected to an orthogonal feature or a corner and if the answer is YES, then proceeding to step (k) and if the answer is NO, then proceeding to step (l).

6. The method of claim 2, wherein step (f) comprises:
   (h) identifying each critical edge of a feature,
   (i) testing whether an edge segment is spaced from its nearest projecting neighboring feature that exceeds the maximum allowable spacing according to said table of SRAF rules,
   (j) if the answer to the test in step (i) is YES, then proceed to step (k) if the answer to the step in test (i) is NO then proceeding to step (l),
   (k) applying a largest feature bias called for in said table of SRAF rules to the feature edge segment in question and then the system proceeds to step (l),
   (l) testing whether all critical edges of a feature have been tested and if a NO answer is obtained return to step (h) or if a YES answer is obtained, then end step (f).

7. The method of claim 6 wherein if the answer in step (i) is YES, then testing whether the segment in question is connected to an orthogonal feature or a corner and if the answer is YES, then proceeding to step (k) and if the answer is NO, then proceeding to step (l).

8. The method of claim 3, wherein step (f) comprises:
   (h) identifying each critical edge of a feature,
   (i) testing whether an edge segment is spaced from its nearest projecting neighboring feature that exceeds the maximum allowable spacing according to said table of SRAF rules,
   (j) if the answer to the test in step (i) is YES, then proceed to step (k) if the answer to the step in test (i) is NO then proceeding to step (l),
   (k) applying a largest feature bias called for in said table of SRAF rules to a target feature edge corresponding to said feature edge segment in question and then the system proceeds to step (l),
   (l) testing whether all critical edges of a feature have been tested and if a NO answer is obtained return to step (h) or if a YES answer is obtained, then end step (f).

9. The method of claim 8, wherein if the answer in step (i) is YES, then testing whether the segment in question is connected to an orthogonal feature or a corner and if the answer is YES, then proceeding to step (k) and if the answer is NO, then proceeding to step (l).

10. A rules-based method for forming a photolithographic mask layout with Sub-Resolution Assist Feature (SRAF) elements on a mask to improve a pattern image in an approach comprising the steps of:
    (a) developing a circuit layout for a mask comprising a main pattern of features,
    (b) providing a set of SRAF rules in an SRAF rules table, relating sizes and placement of SRAF elements as well as biasing of said main pattern of features to compensate for proximity effects as a function of spacing of said main pattern of features,
    (c) applying bias to circuit features as a function of spacing of said main pattern of features according to said SRAF rules,
    (d) applying SRAF elements to said main pattern of features according to said SRAF rules,
    (e) legalizing said SRAF elements,
    (f) identifying problem edge segments of said main pattern of features based on insufficient SRAF element coverage,
    (g) applying a selected bias to said problem edge segments to modify said main pattern of features to modify the pattern of features for the mask locally in areas of SRAF loss, and
    (h) providing an output of a SRAF enhanced, proximity corrected mask layout with locally modified pattern to recover lithographic PW in areas of SRAF element loss.

11. The method of claim 10, wherein step (g) further comprises:
    (j) testing whether said problem edge segment is spaced from its nearest projecting neighboring feature that exceeds the maximum allowable spacing according to said table of SRAF rules,
    (k) if the answer to the test in step (j) is YES, then proceed to step (l) if the answer to the step in test (j) is NO then proceeding to step (m),
    (k) applying a largest feature bias called for in said table of SRAF rules to the feature edge segment in question and then the system proceeds to step (m),
    (l) testing whether all critical edges of a feature have been tested and if a NO answer is obtained return to step (i) or if a YES answer is obtained, then end step (g).

12. A model-based method of forming a photolithographic mask layout with Sub-Resolution Assist Feature (SRAF) elements on a mask to improve an imaged pattern of features comprising the steps of:
    (a) providing a circuit layout comprising a main pattern of features and an initial target image pattern for a desired wafer image corresponding to said circuit layout,
    (b) providing a table of SRAF rules relating the size and placement of SRAF elements as a function of spacing of said main pattern of features,
    (c) applying SRAF elements to the main pattern of features for said mask according to said SRAF rules,
    (d) legalizing said SRAF elements,
    (e) identifying problem edge segments of the main pattern features based on insufficient SRAF element coverage,
    (f) applying a selected bias to target problem edge segments of said initial target image pattern corresponding to said problem edge segments to form a modified target image pattern,
    (g) applying model-based OPC to said circuit layout including said SRAF elements, until a modified circuit layout is found wherein a mask pattern using said modified circuit layout results in a simulated wafer image that substantially conforms to said modified target image pattern within a specified tolerance, and
    (h) providing an output mask layout corresponding to said modified circuit layout.

13. The method of claim 12, wherein step (f) comprises:
    (i) identifying each critical edge of a feature,
    (j) testing whether an edge segment is spaced from its nearest projecting neighboring feature that exceeds the maximum allowable spacing according to said table of SRAF rules,
    (k) if the answer to the test in step (j) is YES, then proceed to step (l) if the answer to the step in test (j) is NO then proceeding to step (m),
    (k) in step (f) applying a largest feature bias called for in said table of SRAF rules to the target problem edge segment in question and then proceeding to step (m),
    (l) testing whether all critical edges of a feature have been tested and if a NO answer is obtained return to step (i) or if a YES answer is obtained, then end step (F).

* * * * *